(12) United States Patent
Basol et al.

(10) Patent No.: US 7,578,923 B2
(45) Date of Patent: Aug. 25, 2009

(54) ELECTROPOLISHING SYSTEM AND PROCESS

(75) Inventors: Bulent M. Basol, Manhattan Beach, CA (US); Homayoun Talieh, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 73 days.

(21) Appl. No.: 10/391,924

(22) Filed: Mar. 18, 2003

(65) Prior Publication Data

US 2004/0007478 A1 Jan. 15, 2004
US 2008/0099344 A9 May 1, 2008

Related U.S. Application Data

(60) Continuation-in-part of application No. 10/093,185, filed on Mar. 5, 2002, now Pat. No. 6,958,114, which is a continuation of application No. 09/877,335, filed on Jun. 7, 2001, now Pat. No. 6,471,847, which is a division of application No. 09/283,024, filed on Mar. 30, 1999, now Pat. No. 6,251,235, application No. 10/391,924, which is a continuation-in-part of application No. 10/302,213, filed on Nov. 22, 2002, now abandoned, which is a continuation of application No. 09/685,934, filed on Oct. 11, 2000, now Pat. No. 6,497,800, application No. 10/391,924, which is a continuation-in-part of application No. 10/238,665, filed on Sep. 9, 2002, now Pat. No. 6,902,659, which is a continuation of application No. 09/607,567, filed on Jun. 29, 2000, now Pat. No. 6,676,822, and a division of application No. 09/201,929, filed on Dec. 1, 1998, now Pat. No. 6,176,992.

(60) Provisional application No. 60/425,694, filed on Nov. 12, 2002, provisional application No. 60/190,023, filed on Mar. 17, 2000.

(51) Int. Cl.
*C25F 3/02* (2006.01)
*B23H 5/06* (2006.01)
(52) U.S. Cl. ....................... 205/663; 205/147
(58) Field of Classification Search ................. 205/640
See application file for complete search history.

(56) References Cited

U.S. PATENT DOCUMENTS

| 3,328,273 A | 6/1967 | Creutz et al. |
| 3,959,089 A | 5/1976 | Watts |
| 4,269,686 A | 5/1981 | Newman et al. |

(Continued)

FOREIGN PATENT DOCUMENTS

WO    WO 99 64647 A    12/1999

(Continued)

*Primary Examiner*—Harry D Wilkins, III
(74) *Attorney, Agent, or Firm*—Knobbe, Martens, Olson & Bear, LLP

(57) ABSTRACT

The present invention provides a process for electropolishing a conductive surface of a semiconductor wafer. During the process, a contact electrode in a contact solution contacts a contact region on surface of the conductive layer with the contact solution. Further, during the process a process electrode in a process solution contacts a process region on the conductive surface with the process solution while applying an electrical potential between the contact electrode and the process electrode to electropolish the surface of the conductive layer of the process region.

19 Claims, 14 Drawing Sheets

U.S. PATENT DOCUMENTS

| | | | |
|---|---|---|---|
| 4,339,319 A | 7/1982 | Aigo | |
| 4,430,173 A | 2/1984 | Boudot et al. | |
| 4,610,772 A | 9/1986 | Palnik | |
| 4,948,474 A | 8/1990 | Miljkovic | |
| 4,954,142 A | 9/1990 | Carr et al. | |
| 4,975,159 A | 12/1990 | Dahms | |
| 5,024,735 A | 6/1991 | Kadija | |
| 5,084,071 A | 1/1992 | Nenadic et al. | |
| 5,171,412 A | 12/1992 | Talieh et al. | |
| 5,256,565 A | 10/1993 | Bernhardt et al. | |
| 5,354,490 A | 10/1994 | Yu et al. | |
| 5,429,733 A | 7/1995 | Ishida | |
| 5,447,615 A | 9/1995 | Ishida | |
| 5,472,592 A | 12/1995 | Lowery | |
| 5,516,412 A | 5/1996 | Andricacos et al. | |
| 5,553,527 A * | 9/1996 | Harrison | 84/319 |
| 5,558,568 A | 9/1996 | Talieh et al. | |
| 5,660,708 A * | 8/1997 | Tezuka et al. | 205/205 |
| 5,681,215 A | 10/1997 | Sherwood et al. | |
| 5,692,947 A | 12/1997 | Talieh et al. | |
| 5,755,859 A | 5/1998 | Brusic et al. | |
| 5,762,544 A | 6/1998 | Zuniga et al. | |
| 5,770,095 A | 6/1998 | Sasaki et al. | |
| 5,773,364 A | 6/1998 | Farkas et al. | |
| 5,779,492 A | 7/1998 | Okuyama et al. | |
| 5,793,272 A | 8/1998 | Burghartz et al. | |
| 5,795,215 A | 8/1998 | Guthrie et al. | |
| 5,807,165 A * | 9/1998 | Uzoh et al. | 451/41 |
| 5,833,820 A | 11/1998 | Dublin | |
| 5,840,629 A | 11/1998 | Carpio | |
| 5,858,813 A | 1/1999 | Scherber et al. | |
| 5,863,412 A | 1/1999 | Ichinose et al. | |
| 5,871,626 A | 2/1999 | Crafts et al. | |
| 5,884,990 A | 3/1999 | Burghartz et al. | |
| 5,897,375 A | 4/1999 | Watts et al. | |
| 5,911,619 A | 6/1999 | Uzoh et al. | |
| 5,922,091 A | 7/1999 | Tsai et al. | |
| 5,930,669 A | 7/1999 | Uzoh | |
| 5,933,753 A | 8/1999 | Simon et al. | |
| 5,954,997 A | 9/1999 | Kaufman et al. | |
| 5,985,123 A | 11/1999 | Koon | |
| 6,004,880 A | 12/1999 | Liu et al. | |
| 6,027,631 A | 2/2000 | Broadbent | |
| 6,056,869 A | 5/2000 | Uzoh | |
| 6,063,506 A | 5/2000 | Andricacos et al. | |
| 6,066,030 A | 5/2000 | Uzoh | |
| 6,071,388 A | 6/2000 | Uzoh | |
| 6,074,544 A | 6/2000 | Reid et al. | |
| 6,103,085 A | 8/2000 | Woo et al. | |
| 6,132,586 A * | 10/2000 | Adams et al. | 205/123 |
| 6,132,587 A | 10/2000 | Jorne et al. | |
| 6,136,163 A | 10/2000 | Cheung et al. | |
| 6,143,155 A * | 11/2000 | Adams et al. | 205/87 |
| 6,176,992 B1 | 1/2001 | Talieh | |
| 6,197,182 B1 | 3/2001 | Kaufman et al. | |
| 6,251,235 B1 * | 6/2001 | Talieh et al. | 204/220 |
| 6,379,223 B1 * | 4/2002 | Sun et al. | 451/41 |
| 6,440,295 B1 * | 8/2002 | Wang | 205/640 |
| 6,471,847 B2 * | 10/2002 | Talieh et al. | 205/147 |
| 6,497,800 B1 * | 12/2002 | Talieh et al. | 204/224 R |
| 6,582,281 B2 * | 6/2003 | Doan et al. | 451/41 |
| 6,855,239 B1 * | 2/2005 | Jairath | 205/80 |
| 2001/0035354 A1 * | 11/2001 | Ashjaee et al. | 205/103 |
| 2002/0074238 A1 * | 6/2002 | Mayer et al. | 205/660 |
| 2003/0226764 A1 * | 12/2003 | Moore et al. | 205/640 |
| 2004/0178060 A1 * | 9/2004 | Ravkin et al. | 204/232 |

FOREIGN PATENT DOCUMENTS

| | | |
|---|---|---|
| WO | WO 00 03426 A | 1/2000 |
| WO | WO 02 064314 A | 8/2002 |

\* cited by examiner

*FIG. 3E*
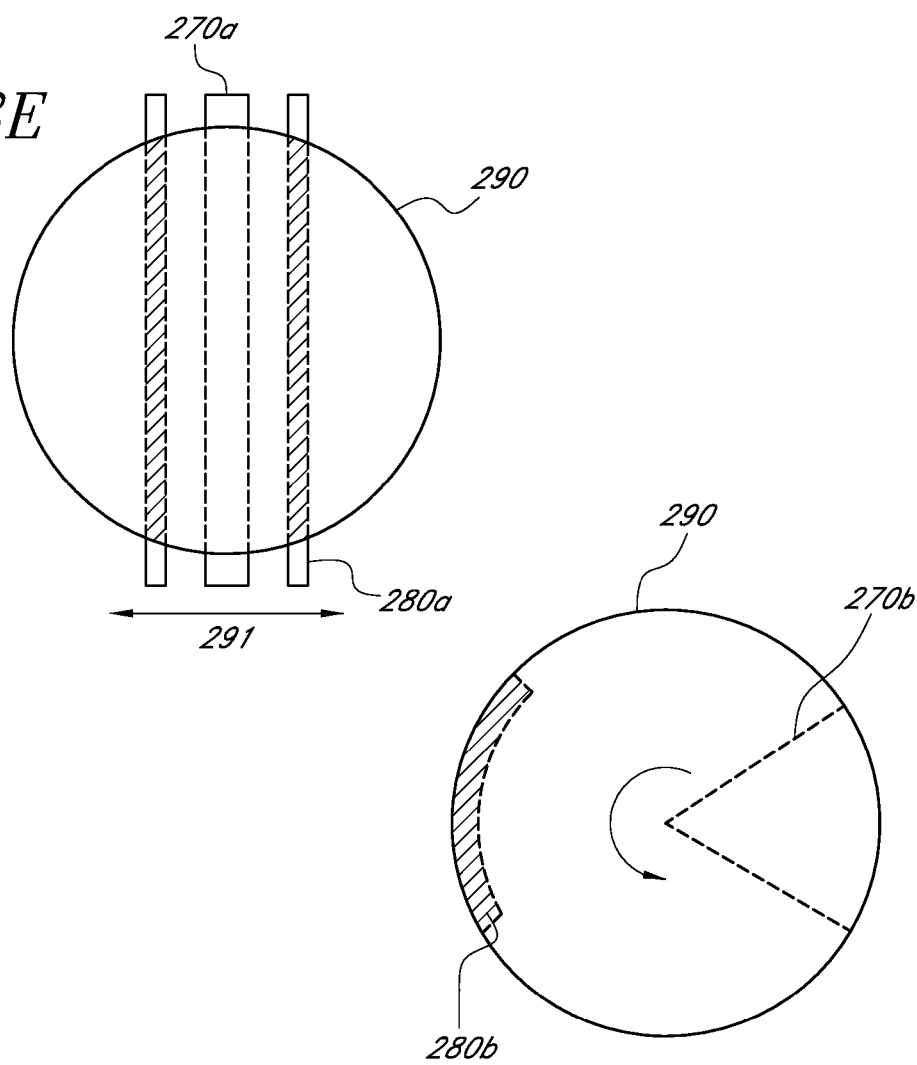
*FIG. 3F*
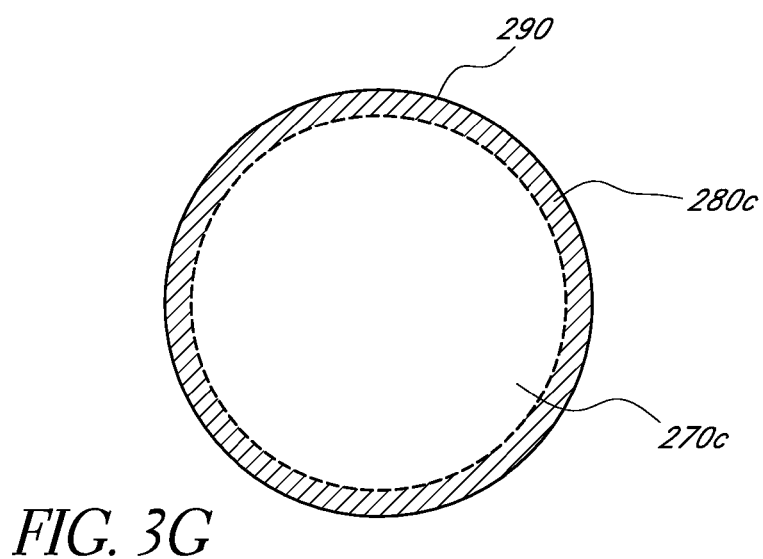
*FIG. 3G*

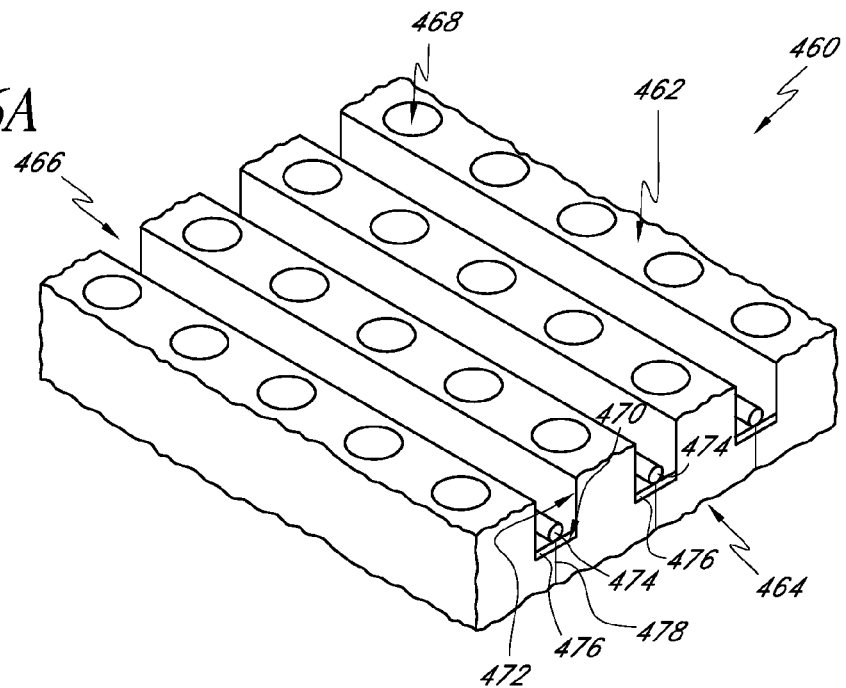
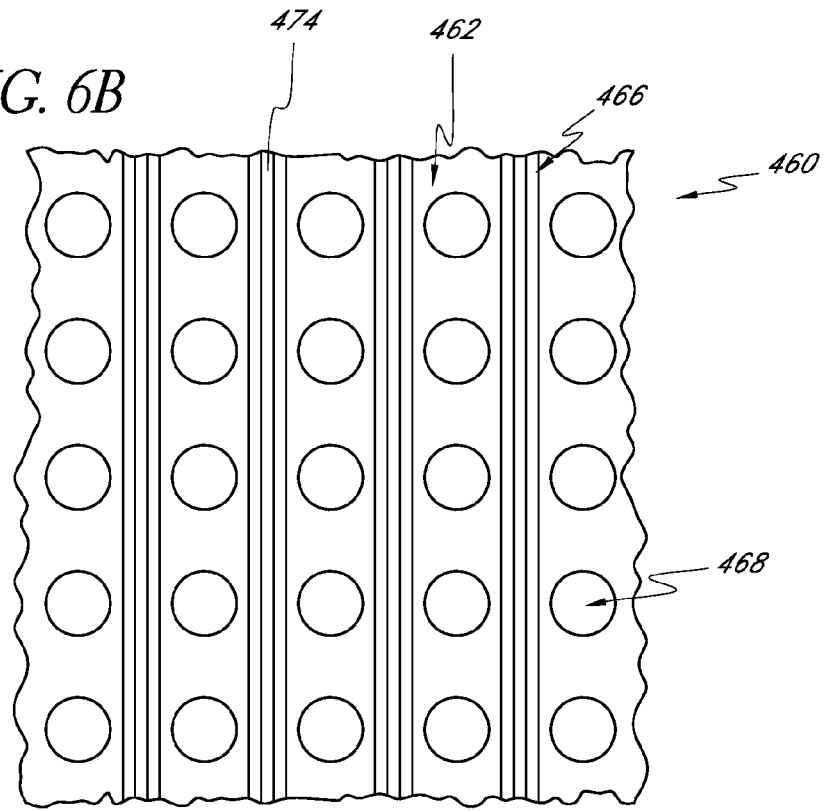

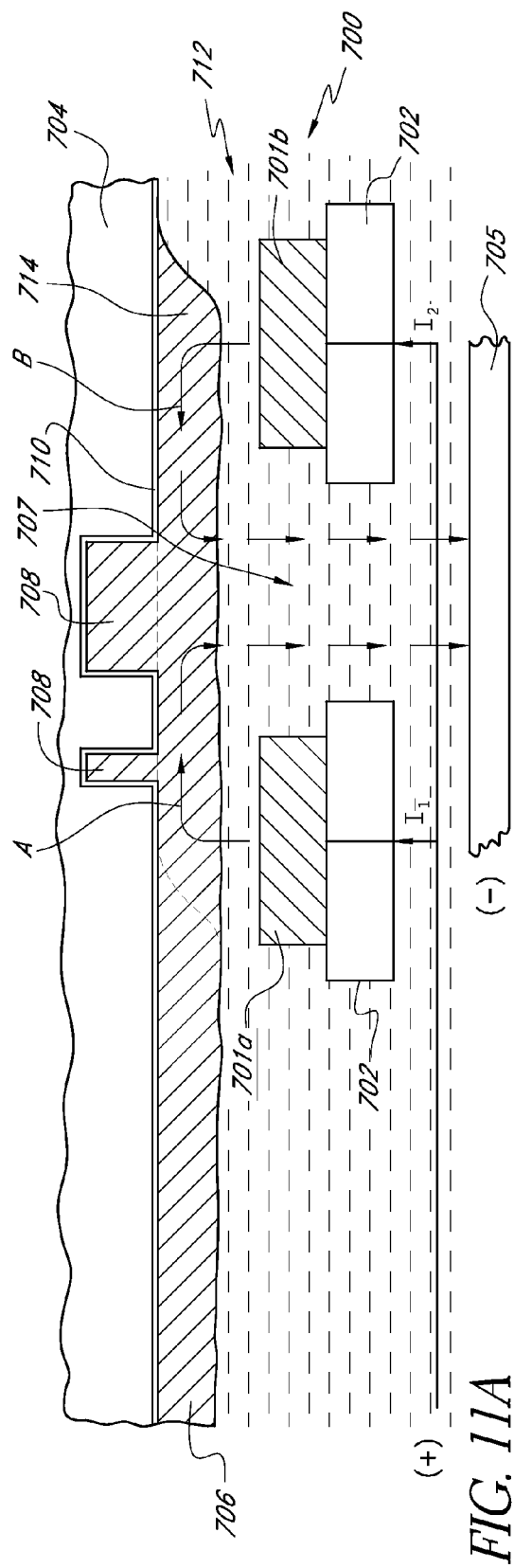
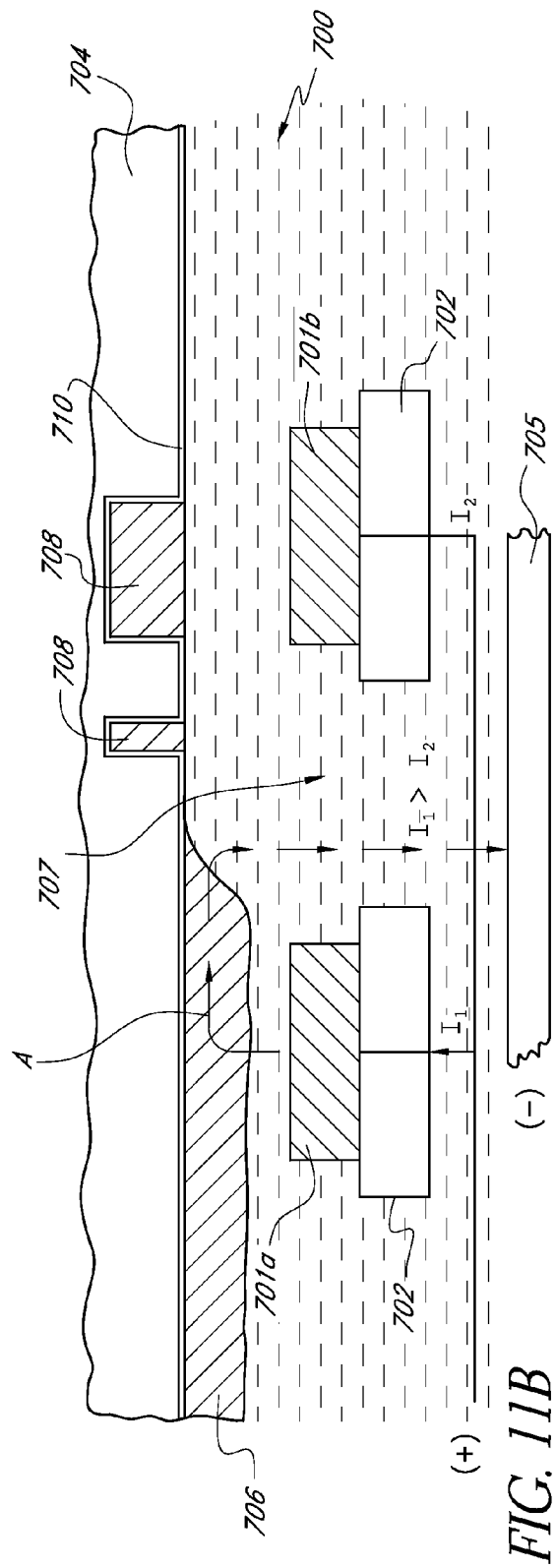
FIG. 11A
FIG. 11B

ELECTROPOLISHING SYSTEM AND PROCESS

RELATED APPLICATIONS

This application claims priority from Provisional Application Ser. No. 60/425,694, filed Nov. 12, 2002, which is incorporated herein by reference. This application is a continuation in part of U.S. application Ser. No. 10/093,185, filed Mar. 5, 2002, now U.S. Pat. No. 6,958,114, which is incorporated herein by reference and which is a continuation of U.S. application Ser. No. 09/877,335, filed Jun. 7, 2001, now U.S. Pat. No. 6,471,847, which is incorporated herein by reference and which is a divisional of U.S. application Ser. No. 09/283,024, filed Mar. 30, 1999, now U.S. Pat. No. 6,251,235, which is incorporated herein by reference. This application is also a continuation in part of U.S. application Ser. No. 10/302,213, filed Nov. 22, 2002, now abandoned which is a continuation of U.S. application Ser. No. 09/685,934, filed Oct. 11, 2000, now U.S. Pat. No. 6,497,800, which is incorporated herein by reference and which claims priority from Provisional Application Ser. No. 60/190,023, filed Mar. 17, 2000. This application is also a continuation in part of U.S. application Ser. No. 10/238,665, filed Sep. 9, 2002, now U.S. Pat. No. 6,902,659, which is incorporated herein by reference and which is a continuation of U.S. application Ser. No. 09/607,567, filed Jun. 29, 2000, now U.S. Pat. No. 6,676,822, which is incorporated herein by reference and which is a divisional of U.S. application Ser. No. 09/201,929, filed Dec. 1, 1998, now U.S. Pat. No. 6,176,992, which is incorporated herein by reference.

FIELD

The present invention generally relates to semiconductor integrated circuit technology and, more particularly, to an electroetching or electropolishing process and apparatus.

BACKGROUND

Conventional semiconductor devices generally include a semiconductor substrate, usually a silicon substrate, and a plurality of sequentially formed dielectric layers such as silicon dioxide and conductive paths or interconnects made of conductive materials. Interconnects are usually formed by filling a conductive material in trenches etched into the dielectric layers. In an integrated circuit, multiple levels of interconnect networks laterally extend with respect to the substrate surface. Interconnects formed in different layers can be electrically connected using vias or contacts.

The filling of a conductive material into features such as vias, trenches, pads or contacts, can be carried out by electrodeposition. In electrodeposition or electroplating method, a conductive material, such as copper is deposited over the substrate surface including into such features. Then, a material removal technique is employed to planarize and remove the excess metal from the top surface, leaving conductors only in the features or cavities. The standard material removal technique that is most commonly used for this purpose is chemical mechanical polishing (CMP). Chemical etching and electropolishing, which is also referred to as electroetching or electrochemical etching, are also attractive process options that are being evaluated for this application. Copper is the material of choice, at this time, for interconnect applications because of its low resistivity and good electromigration properties. Therefore, the present invention will be described for the electropolishing of copper and copper alloy layers as an example, although electropolishing of other materials such as Pt, Co, Ni etc., can also be achieved using the method and apparatus of this invention.

Standard electroplating techniques yield copper layers that deposit conformally over large features, such as features with widths larger than a few micrometers. This results in a plated wafer surface topography that is not flat. FIG. 1A shows a workpiece surface 100 with an exemplary via 102 and an exemplary trench 104 coated with conductor 106 using standard electroplating technique. As can be seen from this figure, although the surface of the conductor 106 may be flat over the small via 102, the surface of the conductor 106 over the larger trench 104 has a step "S". During the excess conductor or overburden removal process step employing CMP, etching or electroetching, this non-flat surface topography needs to be planarized as the excess conductor is removed from the surface leaving it only within the features. If planarization is not achieved, as the thickness of the conductor is reduced, presence of the step S causes loss of conductor from within the large trench. Dashed lines 110 and 112 schematically show how conductor loss from the trench may increase from an amount "d" to a larger amount "D" as the excess conductor thickness on the surface is reduced from "t" to nearly zero, respectively. As can be appreciated, such conductor loss from within features is not acceptable.

CMP techniques have been developed to provide the capability of planarizing and at the same time removing the excess conductor layers. This is shown in FIG. 1B as dashed lines of 120 and 122. After excess conductor removal, the resulting surface is ideally planar as indicated by dashed line 122, and both the via 102 and trench 104 are completely filled with the conductor. It should be noted that any remaining part of the excess conductor along with any other conductor layer (such as a barrier layer) are all removed to assure electrical isolation between the conductors within features 102 and 104.

Planarization capability of standard electroetching techniques is not as good as CMP. Therefore, results from these processes may lie somewhere between the cases shown in FIGS. 1A and 1B. Planarization capability of electroetching may be increased and the ideal result shown as dashed line 122 in FIG. 1B may be approached by employing a planarization pad or workpiece surface influencing device (WSID) which introduces mechanical action on the wafer surface as the conductor removal from the workpiece surface is performed. This way it may be possible to planarize the non-planar or non-flat copper surface as the excess copper is removed. Since there is mechanical action in such processes they are referred to as Electrochemical Mechanical Etching (ECME) or Electrochemical Mechanical Polishing. As the name suggest, in such approaches, electroetching is carried out as the wafer surface is contacted by a planarization pad and relative motion is established between the wafer surface and the planarization pad.

As described above, standard electroplating techniques yield conformal deposits and non-planar workpiece surfaces that need to be planarized during the excess material removal step. Newly developed electrodeposition techniques, which are collectively called Electrochemical Mechanical Deposition (ECMD) methods, utilize a pad or WSID in close proximity of the wafer surface during conductor deposition. Action of the WSID during plating gives planar deposits with flat surface topography even over the largest features present on the workpiece surface. Such a planar deposit is shown as layer 130 in FIG. 1C. Removal of excess conductive material, such as copper from such planar deposits does not require further planarization during the material removal step. Therefore, CMP, electroetching, chemical etching, electrochemical mechanical etching and chemical mechanical etching techniques may all be successfully employed for removing the overburden in a planar and uniform manner in this case.

There are several patents and patent applications describing the electroetching process carried out with the assistance of the mechanical action provided by a pad or WSID. Details of such processes are given in the following patents and patent applications; U.S. Pat. No. 6,402,925; U.S. patent application Ser. No. 10/238,665, entitled Method and apparatus for electroplating and electropolishing, filed Sep. 20, 2002, U.S. patent application Ser. No. 09/671,800 entitled, Method to minimize/eliminate metal coating over the top surface of a patterned substrate and layer structure made thereby, filed Sep. 28, 2000; U.S. patent application Ser. No. 09/841,622 entitled Electroetching system and method, filed Apr. 23, 2001; U.S. patent application Ser. No. 10/201,604 entitled, Multi-step electrodeposition process, filed Jul. 22, 2002; U.S. Provisional Application Ser. No. 60/362,513 entitled, Method and Apparatus for Planar Material Removal technique using multi phase process environment, filed Mar. 6, 2002, U.S. application Ser. No. 10/238,665, entitled Method and apparatus for electroplating and electropolishing, filed Sep. 20, 2002 all commonly owned by the assignee of the present invention.

During the standard electrodeposition and electroetching processes, workpiece or wafer is typically contacted on its front surface near its edge, all around its circumference. The conventional way of contacting the wafer involves a clamp-ring design where electrical contacts such as spring-loaded metallic fingers are pressed against the edge of the surface along the perimeter of the wafer. Contacts are protected from the process solution using seals such as O-rings or lip seals that are pushed against the wafer surface at the edge. Advance of low-k material usage in wafer processing, however, is bringing new restrictions to the use of such contacts. Low-k materials are relatively soft and mechanically weak. Pressing metallic contacts and seals against conductive films deposited on low-k materials causes damage to such materials and may even cause loss of electrical contact since the conductive film over the damaged low-k layer may itself become discontinuous. To address this challenge, a new method for forming an electrical contact to a wafer edge has been disclosed in U.S. Pat. Nos. 6,471,847 and 6,251,235, which are commonly owned by the assignee of the present invention. In this approach there is no metallic contact touching the wafer. Electrical contact is achieved using a liquid conductor, which is confined within a chamber.

Review of the above mentioned art related to Electrochemical Mechanical Etching and Electrochemical Mechanical Deposition techniques will reveal that these methods have the capability to electrotreat, i.e., electrodeposit as well as electropolish, full surface of the wafer without any need to set aside a "contacting region" protected from the process solution, such as the edge surface region that would be under a clamp-ring in an apparatus that uses electrical contacts with a clamp-ring design.

Contact designs that allow full-face electrodeposition or electroetching have been described in the following U.S. patent applications: U.S. patent application Ser. No. 09/685,934 entitled, Making electrical contact to the surface of a workpiece during metal plating, filed Oct. 11, 2000; U.S. patent application Ser. No. 09/735,546 entitled, Method of electrical contact to wafer frontal side for electrochemical plating, filed Dec. 14, 2000; and, U.S. patent application Ser. No. 09/760,757 entitled, Method and apparatus for electrodeposition of uniform film on substrate, filed Jan. 17, 2001, all commonly owned by the assignee of the present invention.

As described in these applications, one method of making electrical contact to the workpiece surface involves physically touching the conductive surface of the workpiece by conductive contact elements, such as wires, fingers, springs, rollers, brushes etc., and establishing a relative motion between the contact elements and the wafer surface so that different sections of the wafer surface is physically and electrically contacted at different times. In another method, electrical contact to the workpiece surface is achieved without physically touching the wafer by the conductive contact elements. Either way, electrical contacts may be made substantially all over the surface of the wafer or only at the edge region of the wafer.

Although much progress has been made in electropolishing approaches and apparatus including contacting means of the workpiece during electropolishing, there is still need for alternative contacting means and electroetching techniques that uniformly remove excess conductive films from workpiece surfaces without causing damage and defects especially on advanced wafers with low-k materials.

SUMMARY OF THE INVENTION

The present invention overcomes the identified limitations of conventional electropolishing approaches and provides alternative contacting means and electroetching techniques that uniformly remove conductive films from a workpiece surface.

In one or more embodiments of the invention, an apparatus and a method for electropolishing a surface of a conductive layer on a work piece are disclosed. The method of the present invention includes the steps immersing a contact electrode in a contact solution, contacting a portion of the surface of the conductive layer with the contact solution to define a contact region, immersing a process electrode in a process solution, contacting a portion of the surface of the conductive layer with the process solution to define a process region, and applying an electrical potential between the contact electrode and the process electrode to electropolish the surface of the conductive layer of the process region.

According to another aspect of the invention, the method further includes the step of moving at least one of the contact or process region from a first location to a second location on the surface of the conductive layer. In moving at least one of the regions from the first location to another location throughout the process, the entire surface of the conductive layer can be electropolished.

In another aspect of the invention, the contact solution and the process solution are the same conductive solution. The conductive solution contacts the surface of the conductive layer.

According to another aspect of the invention, a second contact electrode is provided, and the method further includes the steps of immersing the second electrode in the contact solution, contacting a portion of the surface of the conductive layer with the contact solution to define a second contact region, and applying an electrical potential between the contact electrodes and the process electrode to electropolish the second contact region.

According to another aspect of the invention, the method further includes the step of contacting the surface of the conductive layer with a top surface of a pad thereby planarizing nonuniformities of the surface of the conductive layer during electropolishing. The top surface of the pad may be abrasive. The pad may intermittently contact the surface of the conductive layer.

In another embodiment of the present invention, an apparatus for electropolishing a surface of a conductive layer on a workpiece includes a contact unit containing a contact solution, a contact electrode immersed therein and having an opening through which the contact solution contacts a portion of the surface of the conductive layer to define a contact region, and a process unit containing a process solution, a process electrode immersed therein and having an opening through which the process solution contacts a portion of the surface of the conductive layer to define a process region configured to electropolish the surface of the conductive layer defined by the process region in response to a potential difference applied between the contact electrode and the process electrode.

According to other aspects of the invention, the contact electrode and/or the process electrode may be proximate to the surface of the conductive layer. The potential difference includes a DC voltage or a variable voltage.

According to yet another aspect of the invention, a mechanism produces relative motion between the process region and the surface of the conductive layer to electropolish substantially the whole surface of the conductive layer on the workpiece. The mechanism may further produce relative motion between the contact region and the surface of the conductive layer.

According to additional aspects of the invention, the process unit includes a plurality of process openings through which the process solution contacts portions of the surface of the conductive layer to define a plurality of process regions and the potential difference applied between the contact electrode and the process electrode electropolishes the surface of the conductive layer defined by the plurality of process regions. Moreover, the contact unit includes a plurality of contact openings through which the contact solution contacts portions of the surface of the conductive layer, each contact opening includes a contact electrode disposed therein and the potential difference applied between the contact electrodes and the process electrode electropolishes the surface of the conductive layer defined by the plurality of process regions.

In yet other aspects of the invention, a first set of contact units is configured to contact portions of the surface of the conductive layer wherein the potential difference applied between the contact electrodes of the first set of contact units and the process electrode electropolishes the surface of the conductive layer defined by a first set of process regions. Moreover, a second set of contact units is configured to contact portions of the surface of the conductive layer wherein a second potential difference applied between the contact electrodes of the second set of contact units and the process electrode electropolishes the surface of the conductive layer defined by a second set of process regions.

In yet another aspect of the invention, a zone switch is configured to select the first contact zone or the second contact zone to apply the potential difference. The potential difference and the second potential difference may be different voltages.

The above and additional advantages of the present invention will become apparent to those skilled in the art from a reading of the following detailed description when taken in conjunction with the accompanying drawings.

BRIEF DESCRIPTION OF THE DRAWINGS

FIGS. 3E-3G are schematic illustrations of various designs of the contact units and process units for establishing electrical contact with and processing a wafer surface;

FIGS. 6A-6B are schematic illustrations of a holder structure used with the electropolishing system of the present invention;

FIGS. 11A-11B are schematic illustrations of stages of an electropolishing process using the electropolishing system shown in FIG. 10A.

DETAILED DESCRIPTION

As will be described below, the present invention provides a method and a system to electroetch or electropolish a conductive material layer deposited on a surface of a semiconductor. The invention can be used with Electrochemical Mechanical Etching processes or conventional electroetching systems. The present invention achieves electroetching of the conductive material through the combination of the use of a process solution and electrical contact elements that do not make physical contact to the workpiece surface.

Figure 2A:
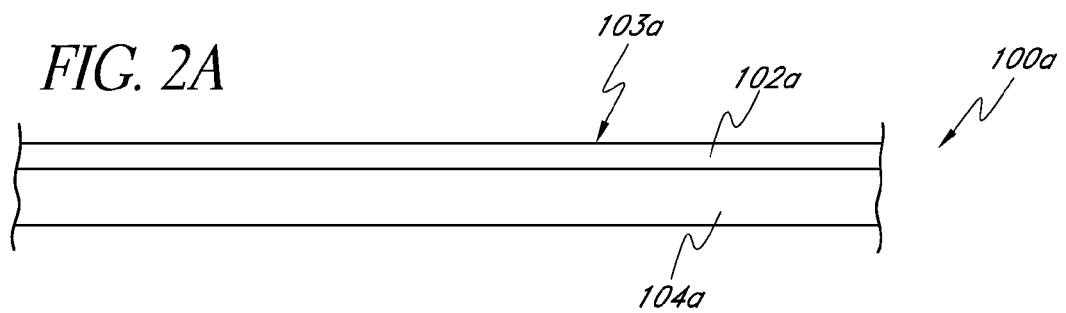
FIG. 2A is a schematic cross-sectional view of a portion of a semiconductor wafer having a copper layer formed on it.
Figure 2B:
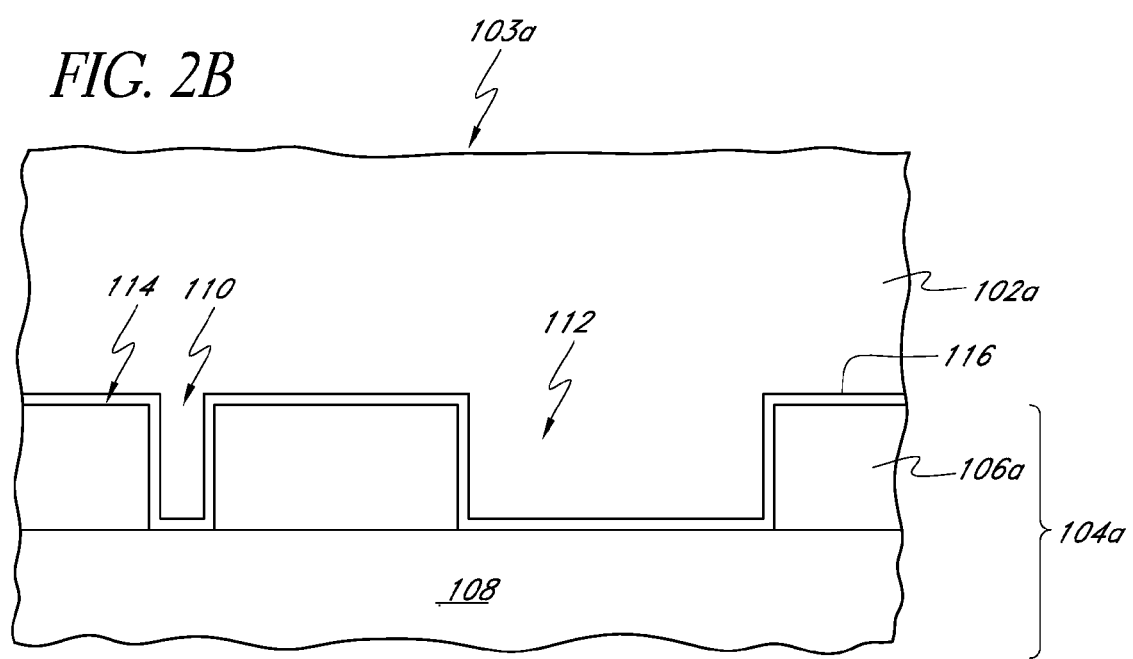
FIG. 2B is a schematic cross sectional view of the semiconductor wafer in detail.

Reference will now be made to the drawings wherein like numerals refer to like parts throughout. FIG. 2A shows a cross-sectional view of a portion of a workpiece 100a. The workpiece may be an exemplary portion of a preprocessed semiconductor wafer. As also shown in FIG. 2B in detail, a top layer 102a of the workpiece 100a may include a layer of conductive material such as electroplated copper. A bottom layer 104a of the workpiece may include an insulating layer 106a such as a low-k dielectric film and substrate 108 of the wafer, preferably silicon. In this embodiment, although the conductive layer 102a is a part of the workpiece 100a, it is within the scope of the present invention that the workpiece 100a may be entirely made of a conductive material.

The insulating layer is patterned to provide a via feature 110 and a trench feature 112. The features and surface 114 of the insulating layer may be lined with a barrier layer 116 such as a layer of Ta, TaN, Ti, WCN, WN, TiN or a composite of these materials. The barrier layer may be also coated with a conductive seed layer such as a copper seed layer that is not shown in FIG. 2B for the purpose of clarity. Such seed layers are commonly deposited on semiconductor wafers before conductive layer deposition. The workpiece 100a may comprise a plurality of via, trench and other features. As illustrated in FIG. 2B, in order to exemplify one embodiment of the present invention the surface 103a of the conductive layer 102a may be planar, i.e. may not have a surface topography having high and low regions formed during the deposition of the conductive layer 102a. It should be appreciated that the invention can also process non-planar wafer surfaces.

Figure 3A:
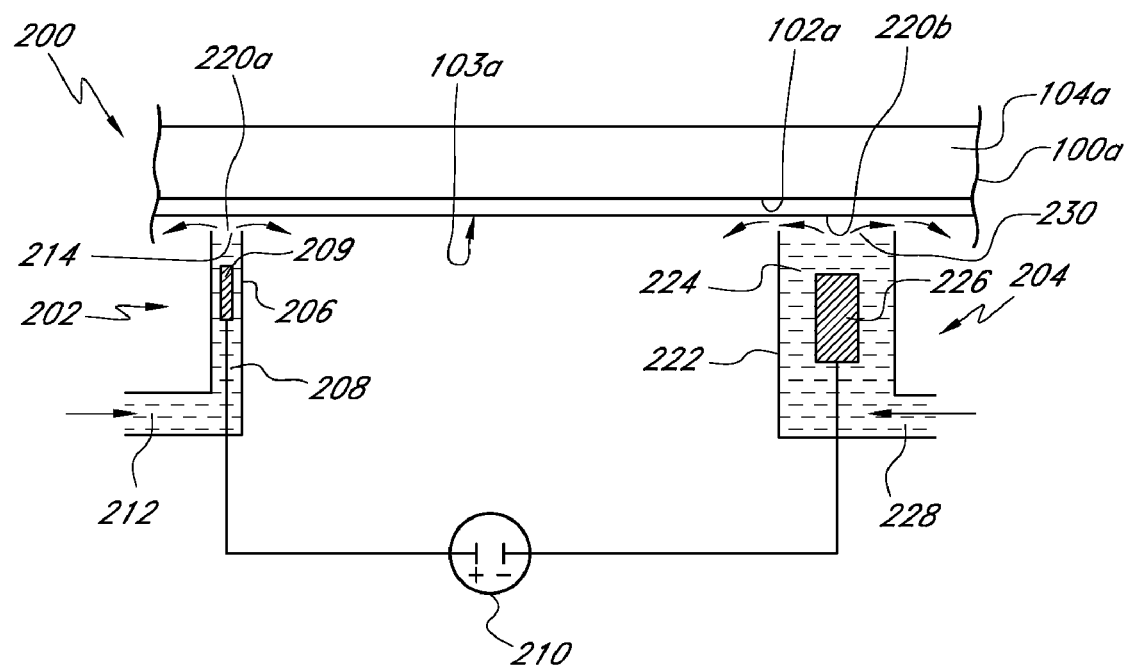
FIG. 3A is a schematic illustration of an embodiment of an electropolishing system of the present invention.

FIG. 3A schematically explains how electropolishing of a material on a wafer surface may be achieved using a remote electrical contact to the wafer. The cross-sectional segment in FIG. 3A shows a portion of an exemplary electroetching or electropolishing system 200 to electrochemically etch a portion of the copper layer 102a, off the surface of the workpiece 100a, which is held by a wafer carrier (not shown). The electroetching system in this example embodiment has a contact unit 202 and a process unit 204. As will be described more fully below, the contact unit 202 is able to establish electrical contact with the conductive layer 102a through a liquid contact solution.

In this respect, the contact unit 202 comprises a contact container 206 or a contact nozzle to contain a contact solution 208. A contact electrode 209 is placed inside the contact container 206 and thus immersed in the contact solution 208. The contact electrode does not physically touch the surface 103a of the copper layer 102a. The contact electrode 209 is electrically connected to a positive terminal of a power source 210. Contact solution 208 fills the container through a contact inlet 212 and leaves the container through contact opening 214. The inlet 212 may be connected to a contact solution reservoir (not shown). The contact opening 214 is placed in close proximity of a contact region 220a of the surface 103a of the conductive layer 102a. As the contact solution 208 flows through the opening 214, it physically touches the contact area and establishes electrical communication between the electrode 209 and the contact region 220a since it is a conductive liquid. For lowest voltage drop, the contact electrode 209 is as close as possible to the contact area 220a. However, if the resistivity of the contact solution 208 is low and the voltage drop is not a concern the contact electrode 209 may even be placed outside the contact container and placed anywhere as long as it maintains physical contact with the contact solution 208.

The process unit 204 comprises a process container 222 or a process nozzle to contain process solution 224, which is an electroetching or electropolishing solution. A process electrode 226 is located inside the process container 222 and kept immersed in the process solution 224. It should be noted that the process electrode does not have to be confined in the process container. It may be outside as long as it physically touches the process solution and therefore establishes electrical contact with it. The process electrode 226 is electrically connected to a negative terminal of the power source 210.

Process solution 224 fills the process container through a process inlet 228 and exits the container through process opening 230. The process solution 224 can be re-circulated or agitated. The inlet 228 may be connected to a process solution reservoir (not shown). The process opening 230 is placed in close proximity of a process region 220b of the surface 103a of the conductive layer 102a. In this embodiment, the process region 220b may be approximately equal to the area of the process opening 230. The process solution 224 flowing through the opening 230 contacts the process region 220b and establishes electrical contact between the process electrode 226 and the process region 220b. Although a specific contact region and process region are illustrated in FIG. 3A, it is understood that these regions may be located anywhere on the workpiece. Furthermore, a plurality of contact units and process units may be used. The contact solution and the process solution may be different solutions or they may be same. If they are the same solution, they need to be effective electroetching or electropolishing solutions for the material to be removed from the workpiece surface.

Figure 3B:
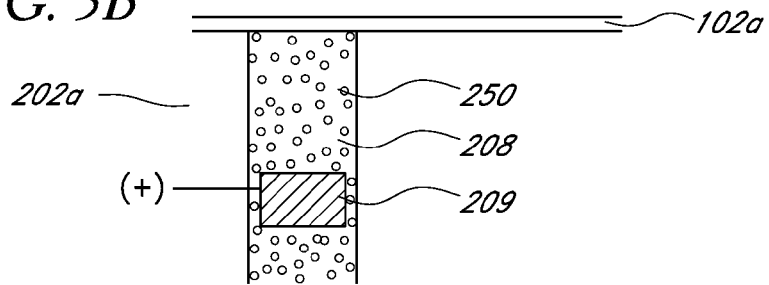
FIGS. 3B-3D are schematic illustrations of various embodiments of the contact units for establishing electrical contact with wafer surface through the process solution.

The contact units and process units may be constructed in different ways using various different materials. For example, it is possible that the contact electrode 209 is on the wall of the container 206 or it actually is the wall of the container 206. Similar approach may be used for the construction of the process container 222. The contact or process units may comprise an insulating spongy material within which the conductive electrodes are embedded. FIG. 3B shows such a case for the contact unit 202a, comprising insulating spongy material 250, which holds and passes through the contact solution 208. Contact electrode 209 touches the contact solution 208 in the sponge 250. It should be noted that, as shown in FIG. 3B, the spongy material may physically touch the copper film 102a surface during electropolishing since it is a soft material and does not damage the surface. Similarly, use of an insulating spongy material or insulating soft pad in the construction of the process unit, which may physically contact the wafer surface during processing is within the scope of this invention.

Figure 3C:
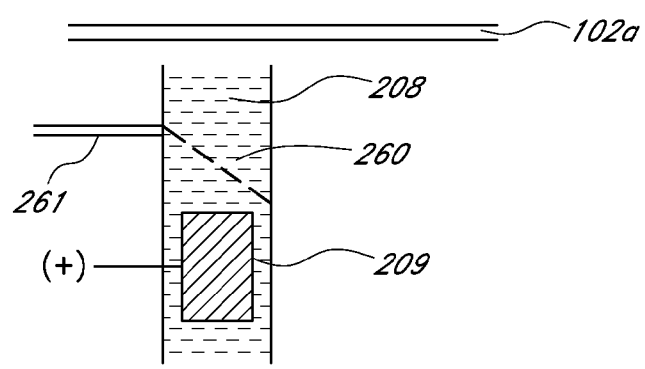
Figure 3D:
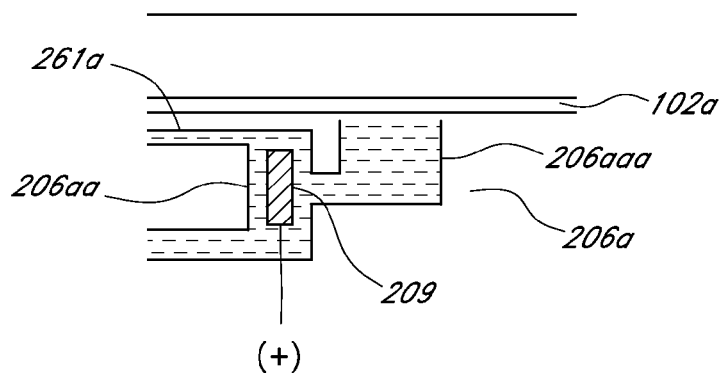

Referring to FIG. 3A, electroetching of the copper layer 102a is initiated at the process region 220b when a potential is applied between the contact electrode 209, which is anode, and the process electrode 226, which is cathode. The electrical current passes from the contact electrode 209 to the contact solution 208 and through the contact solution enters the copper layer 102a at the contact region 220a. The current then flows in the copper layer 102a towards the process region 220b, enters the electroetching solution 224 and flows to the process electrode 226. In this respect, the contact electrode 209 is more anodic than the copper film at the contact region 220a and the copper film at the process region 220b is more anodic than the cathode 226. The anodic voltage on the copper film at the process region causes electropolishing or electroetching of the copper in this particular region. The copper removed from the substrate in this region deposits on the process electrode 226. If the solution is formulated to contain complexing agents it is possible that copper complexes to stay in the solution rather than deposit on the process electrode 226. We will, however, continue giving the example of the case where the solution is a standard electroetching solution such as a phosphoric acid solution. The contact electrode 209 is made of an inert material such as Pt or Pt-coated metal, stainless steel, conductive mesh or foam etc., and therefore anodic voltage on this inert electrode cannot remove any material. It may, however, generate bubbles of gas, which can be removed by the flowing solution or by other designs built in the contact unit. One such design is shown in FIG. 3C and it includes a permeable barrier 260 placed over the contact electrode 209. The permeable barrier 260 is porous and it lets the contact solution 208 through. It, however, does not allow the bubbles to go to the substrate surface by guiding them towards a bleed opening 261, which directs them away from the workpiece surface. Similar structure may be used in the process unit also. Another design shown in FIG. 3D is a two-chamber contact container 206a, which comprises a primary container 206aa and a secondary container 206aaa. The contact electrode 209 is placed in the primary container 206aa, and therefore any bubble that is generated may be diverted away from the substrate surface through the bleed opening 261a. More complex designs of contact containers and process containers utilizing multi chambers can be used for bubble minimization or elimination.

Referring back to FIG. 3A, since the copper film at the contact region 220a is more cathodic compared to the contact electrode 209, no copper dissolution is expected in this region. In fact, copper is protected by this cathodic voltage. In this respect, it is important that the contact solution does not contain any ions of materials that can deposit onto the surface of the copper layer and the contact electrode 209 does not contain any material that may be etched or electroetched by the contact solution 208. Therefore, deposition solutions containing ionic species of metals are not suitable for use as a contact solution.

During the process, the process unit is preferably moved between the edge of the workpiece and the center of the workpiece while the workpiece is rotated or otherwise moved. The movement of the process unit along the radius of the wafer can cause electoetching of the entire surface of the wafer as the wafer is rotated. Other motions can also be used. What is important is to make every point on the wafer a process region at some point in time to remove copper from substantially the whole surface. Scanning of the wafer surface by the process unit can be accomplished by moving the wafer, the process unit or both with respect to each other.

It is possible to design contact units and process units in different shapes and forms. These designs include but are not limited to circular, oval, pie shape, linear and others and they define the shape of the contact region and the process region. Depending upon the nature of the relative motion established between the workpiece surface and the contact and process units the most appropriate shapes of these units may be selected for the most uniform electroetching. Three of such examples are shown in FIGS. 3E, 3F, and 3G, which show the top view of process units 270a, 270b and 270c, and contact units 280a, 280b and 280c. Wafer 290 is placed in close proximity (preferably 0.1 to 5 mm range depending on the conductivity of the solutions used) of the process and contact units so that its copper coated surface (not shown) is wetted by the process and contact solutions. As explained before, when the electroetching process is initiated wafer 290 in FIG. 3E may be translated over the contact units 280a, and the process unit 270a in a linear direction 291. Wafer may also be slowly rotated. The linear motion may or may not be bi-directional. During process, the process unit 270a effectively scans the whole surface of the wafer for uniform material removal. Multiple contact units assure electrical contact to wafer at all times. Even more process and contact units may be used in the design (see for example, FIGS. 6A, 6B, 7A, 7B, 8A, 8B, 9A, 9B). A specific design of contact unit 280b and process unit 270b, appropriate for rotational motion of the wafer 290 is shown in FIG. 3F. The pie-shaped process region in this case scans the wafer surface for uniform material removal from the whole front surface. Contact unit 280b may be placed anywhere at the edge of the wafer. Again, multiple contact and process units may be utilized in this design. In FIG. 3G, a ring-shaped contact region is provided. The process region, where material removal is carried out constitutes the rest of the wafer surface. In this case copper left in the contact region needs to be removed later using another process such as chemical etching or electrochemical etching. There are many other shapes and forms of the process and contact units that can be optimized for best uniformity of material removal.

Figure 4A:
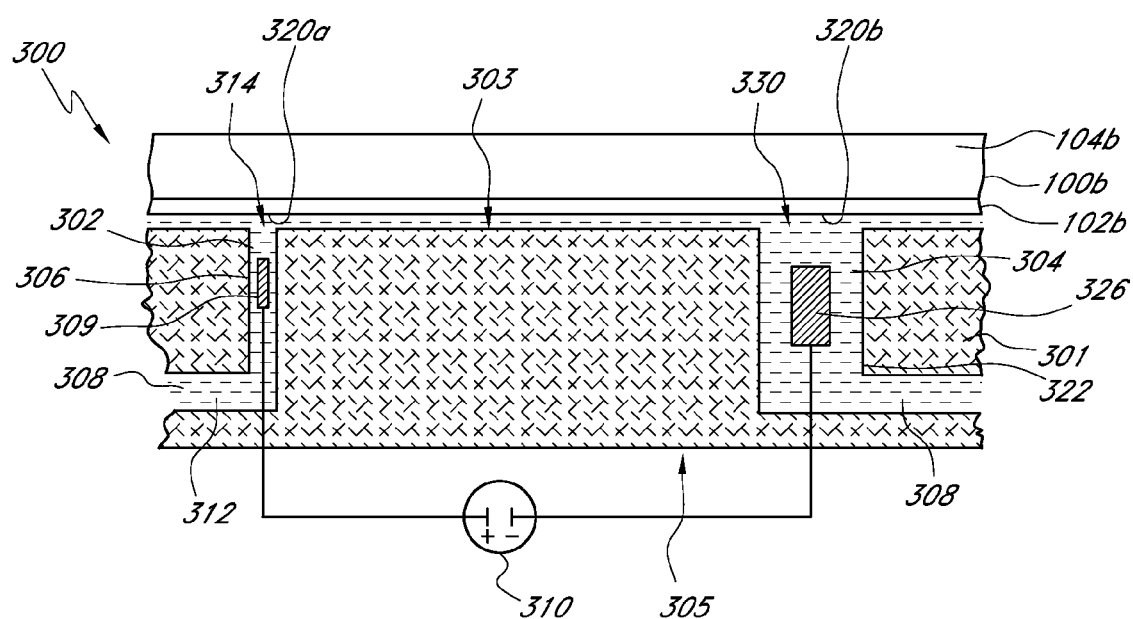
FIG. 4A is a schematic illustration of another embodiment of an electropolishing system of the present invention including multiple contact and process electrodes.
Figure 4B:
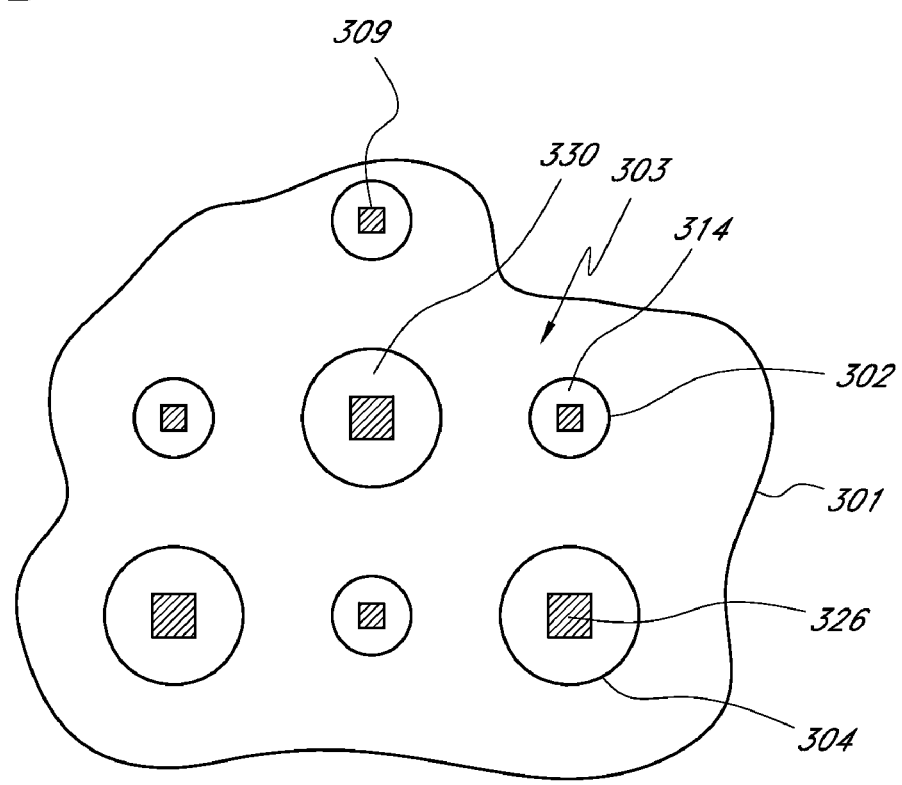
FIG. 4B is a schematic planar view of the electropolishing system shown in FIG. 4A.
Figure 5:
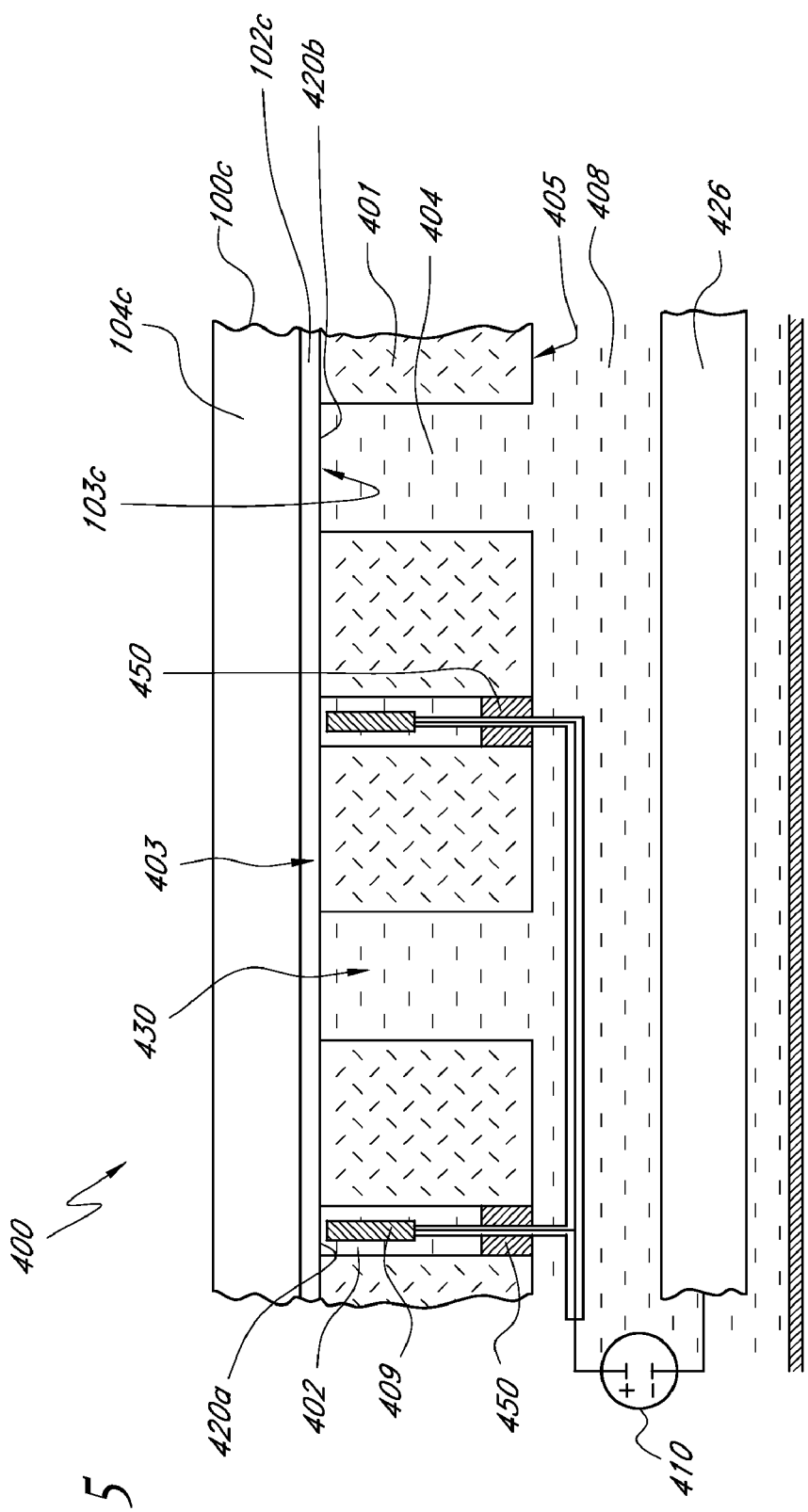
FIG. 5 is a schematic illustration of yet another embodiment of an electropolishing system of the present invention using multiple contact electrodes with a single process electrode.

FIGS. 4A, 4B and 5 illustrate two alternative electroetching systems that may include a plurality of contact units and process units. The contact and process units in these embodiments are held by various base structures that allow units to use the same electroetching solution as the contact solution as well as the process solution. In both embodiments, electrical contact to the wafer surface is established through the electroetching solution applied through the contact units. The contact electrodes do not physically contact to the surface of the wafer, however, as described earlier a soft, sponge or pad like material may be placed in the contact or process units and this material may touch the workpiece surface at the contact region and the process region. The electroetching solution provides the conductive path between the contact electrode and the conductive surface of the wafer.

Exemplary electroetching or electropolishing system 300 of FIG. 4A may be used for processing copper layer 102b of the substrate 100b, which is held by a carrier (not shown). The electroetching system in this example embodiment has also a contact unit 302 and a process unit 304. Differing from the previous embodiment, the units 302, 304 are held by or formed in a holder structure 301. The holder structure 301 in this embodiment is shaped as a plate having a top surface 303 and a bottom surface 305. As described in the previous embodiment, the contact unit 302 is able to establish electrical contact with the conductive layer 102b through a liquid electrical contact. During the process, the holder structure 301 and the workpiece may be moved relative to one another. The contact unit 302 or a contact nozzle may be comprised of a contact hole 306 formed in the holder structure 301. A contact electrode 309 inside the contact unit 306 is immersed in an electroetching solution 308. It should be understood that the contact electrode shown in FIG. 4A may totally fill the contact hole 306 in which case the electroetching solution 308 would mainly wet the top surface of the contact electrode 309. The top surface of the contact electrode may be below the level of the top surface 303 of the holder structure 301 as shown in FIG. 4A, it may be at the same level as the top surface 303 of the holder structure 301, it may even be above the top surface 303 of the holder structure 301 as long as it does not touch the surface of the wafer. These embodiments are applicable to all examples herein and any variations thereof.

In this embodiment, the electroetching solution 308 is used for both establishing contact and electroetching the conductive layer 102b. The contact electrode 309 is electrically connected to a positive terminal of a power source 310. The electroetching solution 308 fills the unit and touches the conductive layer. The contact opening 314 is preferably in the plane of the top surface 303 of the holder structure 301. The inlet 312 may be connected to a common electroetching solution reservoir (not shown) or the whole structure may be immersed into an electroetching solution that fills all the gaps including the contact unit and the process unit. The contact opening 314 is placed in close proximity of a contact region 320a of the surface 103b of the conductive layer 102b. Since the holder structure 301 and the wafer 100b is moved relative to one another during the process, the contact region 320a may be at any appropriate location on the surface of the wafer and may be at any location at a given instant. As the solution 308 wets the contact region, the solution establishes electrical contact between the electrode 309 and the contact region 320a since the solution 308 is selected to be conductive.

The process unit 304 may be comprised of a process hole 322. A process electrode 326 is in physical contact with the solution 308. The process electrode 326 is electrically connectable to a negative terminal of the power source 310. The top surface 303 of the holder structure is placed across the surface of the wafer in a substantially parallel fashion during the process. In this respect, the process opening 330 is placed in close proximity of a process region 320b of the surface 103b of the conductive layer 102b. In this embodiment, the process region may be approximately equal to the area of the opening 230. Due to the relative motion between the wafer and the holder structure 301, the process region 320b may be at various locations on the surface 103b of the wafer at different times during the process.

FIG. 4B shows, the top surface 303 of an exemplary holder structure 301 in plan view. The top surface 303 comprises contact and process openings 314, 330 of the units 302 and 304, which may be distributed in a predetermined pattern. Shapes of the process openings and contact openings shown in FIG. 4B are only exemplary, and as discussed in relation to FIGS. 3A, 3B, 3C, 3D, 3E, 3F, 3G, various shapes and forms of process or contact units may be employed. The contact electrodes 309 and process electrodes 326, which are immersed in the electroetching solution may also have any geometrical shape and cross section. They may be in the form of mesh or even conductive foam.

During the process, the surface 303 is substantially parallel to the conductive surface of the wafer to perform uniform electroetching. Electroetching solution 308 contacts the process region 320b and establishes electrical contact between the electrode 326 and the process region 320b. The electroetching of the copper layer 102b is initiated when a potential is applied between the contact electrode, which becomes an anode and the process electrode, which becomes a cathode. The electrical current passes from contact electrode 309, into the electroetching solution 308 and enters the copper layer 102b at the contact region 320a. The current then flows in the copper film 102b towards the process region 320b, enters the electroetching solution 308 and flows to the cathode 326. Although, there may be electroetching solution between the surface 103b of the wafer and the top surface 303 of the holder 301, the resistivity of this electroetching solution is much higher than the resistivity of copper layer. If the distance between the surface of the holder structure and the surface of the wafer is small enough, such as 0.1-5 mm, the total resistance of this section of the etching solution will also be higher. Consequently, the electrical current will substantially follow the path through the copper layer and cause electroetching at the process region 320b. Any leakage of electrical current through the solution itself will reduce the efficiency of material removal since such leakage current would not result in electropolishing of the copper film. It should be noted that in this embodiment the electroetching solution is the common solution for the contact unit and the process unit and the units are in fluid communication through the electroetching solution that exists between the wafer surface and the top surface of the holder structure. As described before, the anodic voltage on the copper layer at the process region 320b causes electropolishing or electroetching of the copper in that region.

During the process, the wafer may be rotated and/or linearly moved over the holder structure 301 to accomplish uniform electroetching over the entire surface of the wafer. The process may be performed by bringing the wafer surface 103b in close proximity of the surface 303 of the holder 301 or even by contacting the surface 103b to the top surface 303 of the holder structure 301. If wafer surface is physically contacted to the top surface 303, it is preferable that the top surface comprises a pad material. With the selection of an appropriate pad, an electrochemical mechanical etching or polishing process can be carried out, which can planarize originally non-planar workpiece surfaces as discussed earlier, for electrochemical mechanical etching applications, a soft pad or a pad comprising abrasives on its surface may be employed.

The power sources 210 and 310 shown in FIG. 3A and FIG. 4A provide the power necessary to accomplish electropolishing. It should be understood that the various electrodes described may be all connected to a single power supply or multiple power supplies may be connected groups of electrodes to form zones, which may be controlled independently from each other. For example, a first group of process electrodes may be used to remove copper from the near-edge surface of the wafer and they may be connected to the negative terminal of a first power supply. A second group of process electrodes may scan the central region of the wafer surface to remove copper from this central region. This second group of process electrodes may be connected to the negative terminal of a second power supply. In this case, an electropolishing process may be carried out at the central region of the wafer using the second power supply and the second group of process electrodes. Then copper removal from the near-edge portion may be initiated powering the first group of process electrodes by the first power supply. Ability of independently removing material from multiple different zones on a wafer allows great flexibility in obtaining highly uniform electropolishing. Number of zones and number of electrodes per zone may be as small or large as practical. The contact electrodes may or may not be divided into different zones.

Figure 1A:
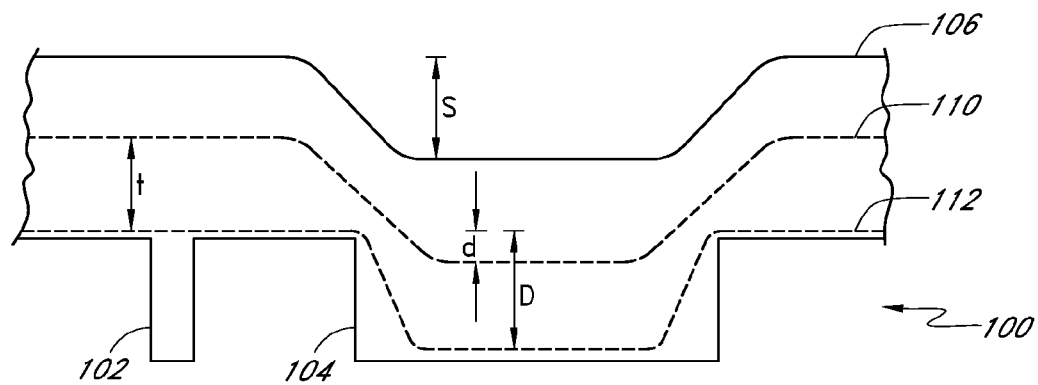
FIG. 1A is a schematic illustration of a substrate having a non-planar copper overburden layer which has been deposited using a conventional deposition process.
Figure 1B:
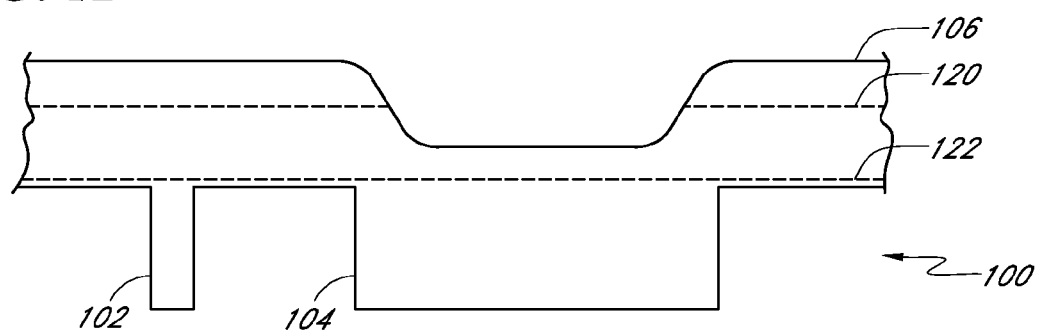
FIG. 1B is a schematic illustration of the substrate shown in FIG. 1A wherein a planarization process has been applied to the non-planar copper overburden layer.
Figure 1C:
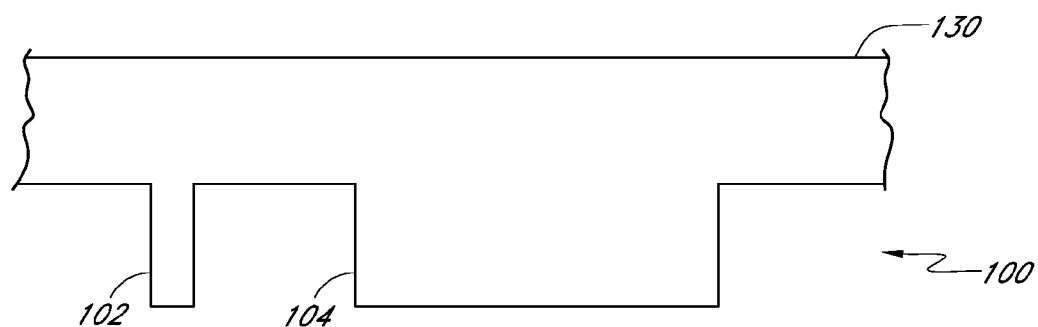
FIG. 1C is a schematic illustration of a substrate having a planar copper overburden layer which has been deposited using an electrochemical mechanical deposition process.

When the copper is removed from a certain zone on the wafer, the electrical current passing through that zone is expected to decrease, if voltage is constant. Alternately, if a constant current source is used as the power supply, as copper is removed from the surface, voltage drop is expected to increase. These changes in the current or voltage can be used to monitor the amount of material removed from the wafer surface. By knowing the position of a certain process area on the wafer surface at a certain time and the value of the current and voltage, one can determine the amount of copper left at that process region. If constant voltage supplies are used as power supplies, as the copper is removed by electroetching at a certain process area, the current value drops and therefore the electroetching rate also drops. This way, self-limiting of the electroetching process is achieved at regions of the wafer where copper is removed. This is important to avoid the copper loss from within the features as indicated in FIG. 1A.

FIG. 5 shows another exemplary electroetching or electropolishing system 400 that can be used to electrochemically etch the copper layer 102c. The system 400 comprises a plurality of contact and process units. In this embodiment, a common cathode, which is immersed in an electroetching solution, is used to electroetch the layer 102c through the process units and provides electrical power to the layer 102c through the contact units. This design is attractive especially for cases where material is being removed from the surface of the wafer and it gets deposited onto the common cathode. Since cathode is large and away from the wafer surface many wafers such as a few thousand wafers can be processed in this approach before the need to clean or replace the cathode. Referring to FIG. 5, a plurality of contact units 402 and process units 404 may be formed in a holder structure 401. The holder structure 401 in this embodiment is also shaped as a plate having a top surface 403 and a bottom surface 405. The system 400 is operated the way the system 300 is operated in the previous embodiment.

In the example shown in FIG. 5, the contact units 402 or contact nozzles are comprised of contact holes 406 formed in the holder 401. Contact electrodes 409 are placed inside the contact holes 406 and thus immersed in an electroetching solution 408. As mentioned before, in this embodiment, the electroetching solution 408 is used for both establishing contact with and electroetching the conductive layer 102c. The contact electrodes 409 are electrically connected to a positive terminal of a power source 410. In this embodiment, the process units 404 or nozzles are comprised of process holes 430 or process openings formed through the holder structure 401. The electroetching solution 408 fills the contact holes 406 as well as the process holes 430. During processing, contact holes are in close proximity of the wafer surface and they define contact regions 420a on the surface 103c of the conductive layer 102c. A common process electrode 426, which is the cathode, is placed in the reservoir and kept in physical contact with the electroetching solution 408. The process electrode 426 is electrically connected to a negative terminal of the power source 410. The electroetching solution 408 fills the process holes 430. In this embodiment, in order to minimize electrical current leakage from the contact electrodes through the electroetching solution to the process electrode, the contact electrodes may be placed very close to the wafer surface and insulating plugs 450 may be used below the contact electrodes. These insulating plugs may or may not be permeable by the solution. Wires connecting the various electrodes to the power supply are preferably isolated from the solution.

During processing, the top surface 403 of the holder 401 may or may not physically contact the wafer surface. If there is physical contact, it is preferred that the top surface 403 comprise a pad. It is also possible to use a fixed abrasive pad at the top surface to sweep the surface of the wafer to assist the material removal process, especially if planarization is required during copper electropolishing step. The holder 401 may itself be made of a pad material with process openings 430 and contact openings 406 cut into it. Contact electrodes 409 may then be placed into this pad. Contact electrodes may be placed very close to the top surface 403 to reduce voltage drop, but they should not protrude beyond the surface 403 to avoid physical contact with the surface of the copper layer 102c. Holder structures having various designs of process openings 430 and contact openings 406 may be employed as explained before.

FIGS. 6A-9B depict some of these different holder structures having various contact and process unit designs. As in all above embodiments, in the following embodiments, the contact electrodes in the contact units do not physically contact the wafer surface that is electropolished. The electrical conduction between the surface of the wafer under process and the contact electrodes is provided through the process solution that is touches the contact electrodes and the surface.

As illustrated in one embodiment, in FIG. 6A in a perspective view and in FIG. 6B in plan view, a holder structure 460 has a top surface 462 and a bottom surface 464. A number of contact units 466 are formed in the top surface 462 of the holder structure 460. Further, a number of process units 468 are formed through the holder structure 460 and between the top surface 462 and bottom surface 464. In this embodiment, the contact units 466 are channels, preferably near-rectangular in cross-section, having a bottom wall 470 and side walls 472. Although in this embodiment, the channels are distributed parallel and separated one another equidistantly, they may be distributed in any manner such as non-parallel or radial and the distance between the channels may vary. The contact electrode 474 is placed in the channel 466, preferably on the bottom wall 470. The electrodes are shaped as bars or wires extending along the channels. Although it is not necessary, there may be a contact base 476 between the electrode 474 and the bottom wall 470. The contact electrodes may be directly placed on the bottom wall 470. If there is, the base 476 may be extended down to the bottom surface of the holder structure 460 and may be made of an insulator. The height of the electrode is at the level of the surface 462 or slightly less than the depth of the channel so that during the process the electrode cannot touch the wafer surface that is electropolished but allow current flow through the process solution. An insulated wire 478 connects the electrode to a terminal of a power supply (not shown). In this embodiment, the process units 468 may be shaped as round holes extending through the holder structure and allowing solution flow to the top surface. Holes 468 may be rectangular or any other geometrical form, including slits. Process units may also be continuous slits in between the channels 466.

It should be noted that the designs of FIGS. 6A, 6B, 7A, 7B, 8A, 8B, 9A, 9B, 10A and 10B will be described as applied to the concept shown in FIG. 5, namely, a design with one cathode and multiple contact electrodes. It should be appreciated, however, that the designs and concepts given in these figures are also directly applicable to the cases shown in FIGS. 3A, 3B, 3C, 3D, 3E, 3F, 3G and 4A. For example, in the design of FIG. 6A, every other channel 466 may be made a contact unit (shown as 302 in FIG. 4A) with a contact electrode 474 in it (shown as 309 in FIG. 4A). In between these contact units then, every other channel 466 could be a process unit (shown as 304 in FIG. 4A), and the electrodes within these process units would be the process electrodes (shown as 326 in FIG. 4A). In this case solution would be fed through the openings (shown as 468 in FIG. 6A), and power would be applied between contact electrodes and process electrodes as shown in FIG. 4A. In this case, a single power source can be used if all contact electrodes are connected together and all process electrodes are connected together. Alternately, as discussed earlier, multiple power supplies can be used to power multiple contact electrode-process electrode pairs, or a single power supply may be switched between various pairs of contact electrode-process electrode.

Figure 7A:
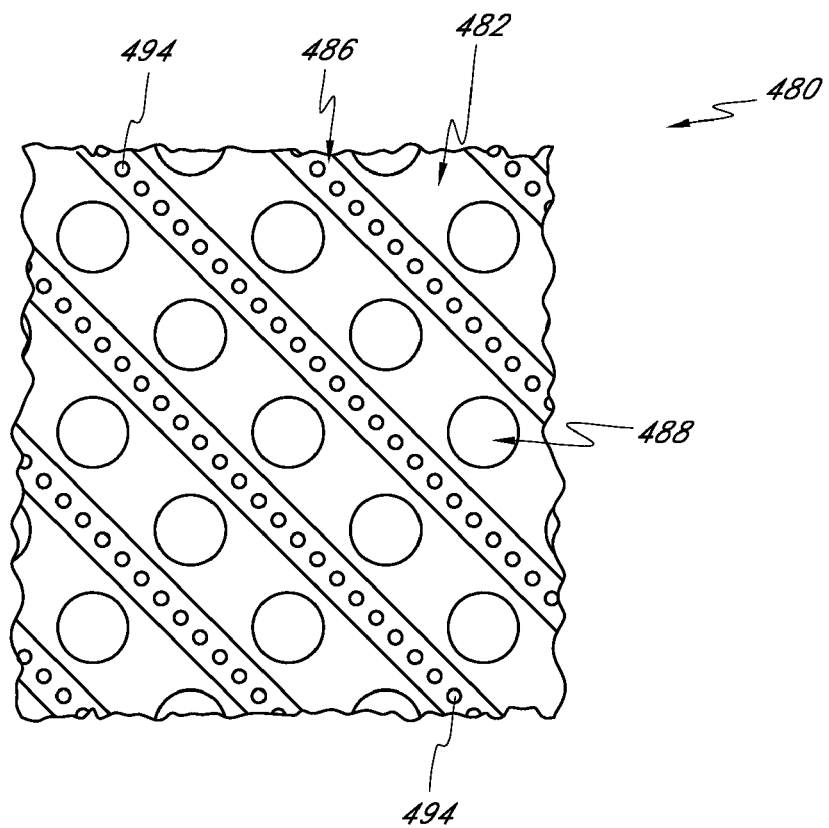
FIG. 7A is a schematic illustration of another embodiment of a holder structure used with the electropolishing system of the present invention.
Figure 7B:
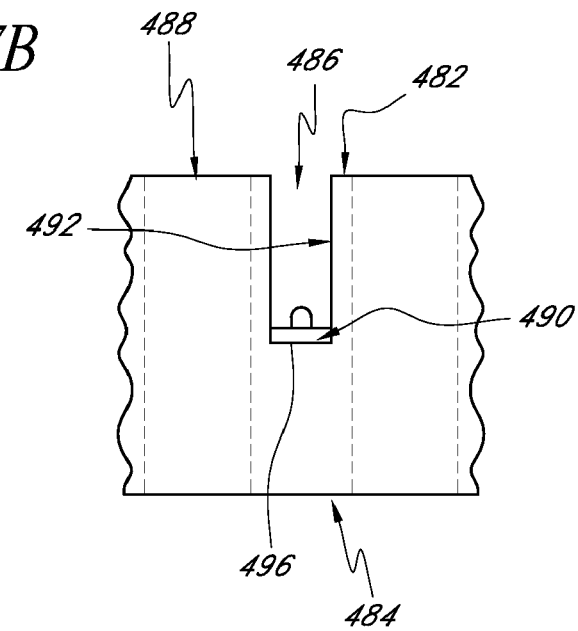
FIG. 7B is a schematic cross-sectional view of a portion of the holder structure of FIG. 7A.

FIG. 7A shows, in plan view and FIG. 7B in partial cross section, another embodiment of a holder structure 480, which is a variation of the holder structure 460 shown in the previous embodiment. The holder structure 480 comprises channels 486 and holes 488. The channels in this example are placed in diagonal fashion and equidistantly parallel to one another. The channels 486 are in rectangular shape and are defined by a bottom wall 490 and side walls 492, as shown in FIG. 7B. Contact electrodes 494 are shaped as beads that are lined along the bottom of the channels 486 and connected a terminal of a power supply (not shown). As described above, the contact electrodes 494 may or may not be placed on an electrode base 496.

Figure 8A:
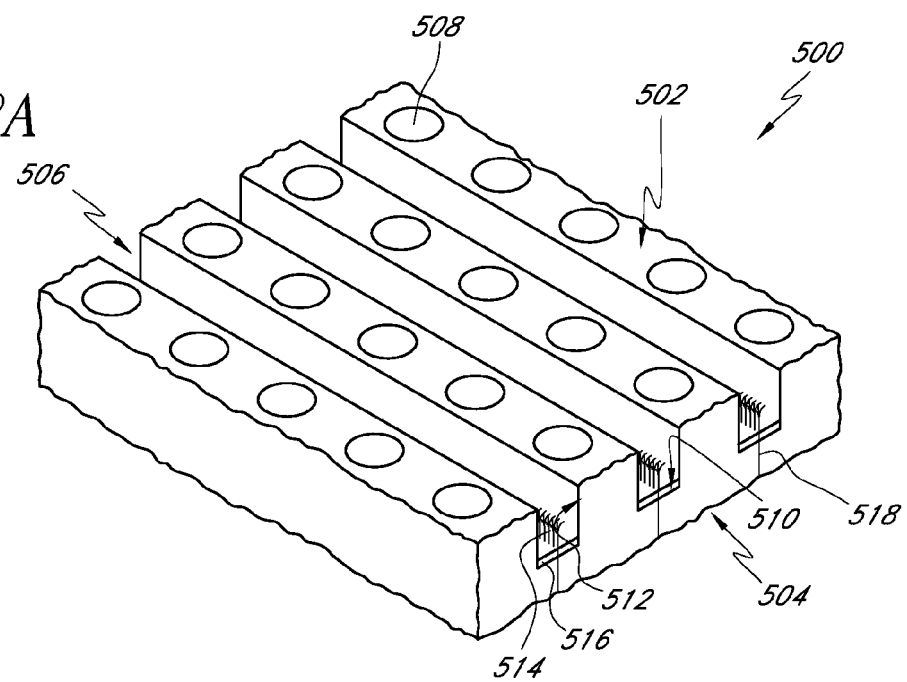
FIGS. 8A-8B are schematic illustrations of another holder structure used with the electropolishing system of the present invention.
Figure 8B:
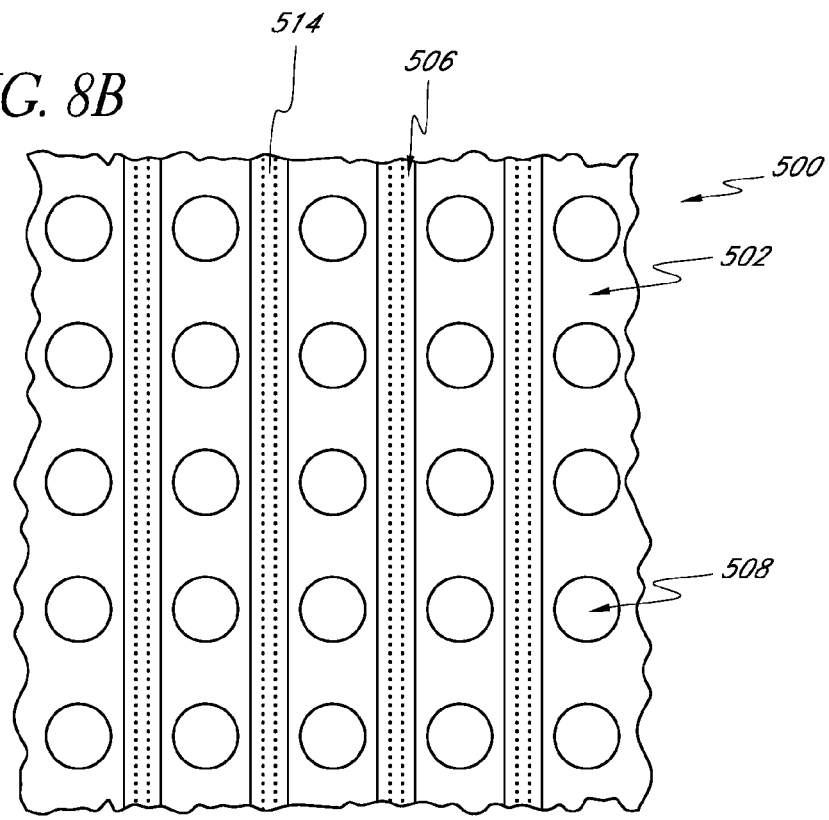

FIGS. 8A-8B illustrate another embodiment of a holder structure 500. In FIG. 8A in a perspective view and in FIG. 8B in plan view, the holder structure 500 has a top surface 502 and a bottom surface 504. A number of contact units 506 are formed in the top surface 502. Further, a number of process units 508 are formed through the holder structure 500 and between the top and bottom surfaces 502, 504. In this embodiment, the contact units 506 are channels, preferably rectangular cross-section, having a bottom wall 510 and side-walls 512. As in the previous embodiments, the channels are distributed parallel and separated one another equidistantly, they may also be distributed in any manner such as non-parallel or radial, and the distance between the channels may vary. In this embodiment, contact electrodes 514 are preferably conductive brushes made of thin conductive wires or bristles. The contact electrodes 514 are placed in the channel 506, preferably on the bottom wall 510. As in the previous embodiments, there may be a contact base 516 between the conductive brushes 514 and the bottom wall 510. The height of the conductive brushes 514 is preferably slightly less than the depth of the channel 506 so that during the process brushes 514 cannot touch the wafer surface that is electropolished but allow current to flow through the process solution. As in the previous embodiments, the base 516 may be extended down to the bottom surface of the holder structure 500 and may be made of an insulator. An insulated electrical line 518 connects the conductive brushes to a terminal of a power supply (not shown). In this embodiment, the process units 508 may be shaped as round holes extending through the holder structure and allowing solution flow to the top surface during the process. Holes 502 may be rectangular or any other geometrical form.

Figure 9A:
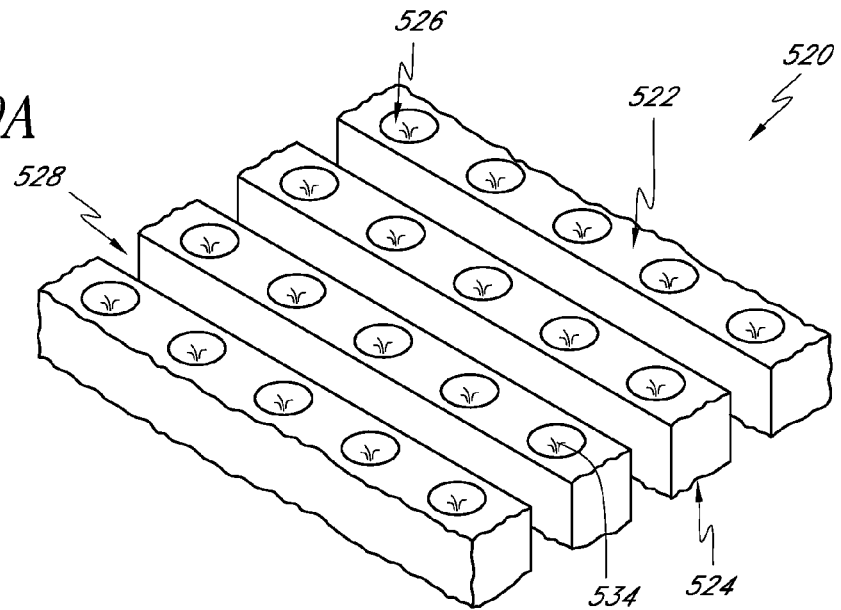
FIGS. 9A-9B are schematic illustrations of yet another holder structure used with the electropolishing system of the present invention.
Figure 9B:
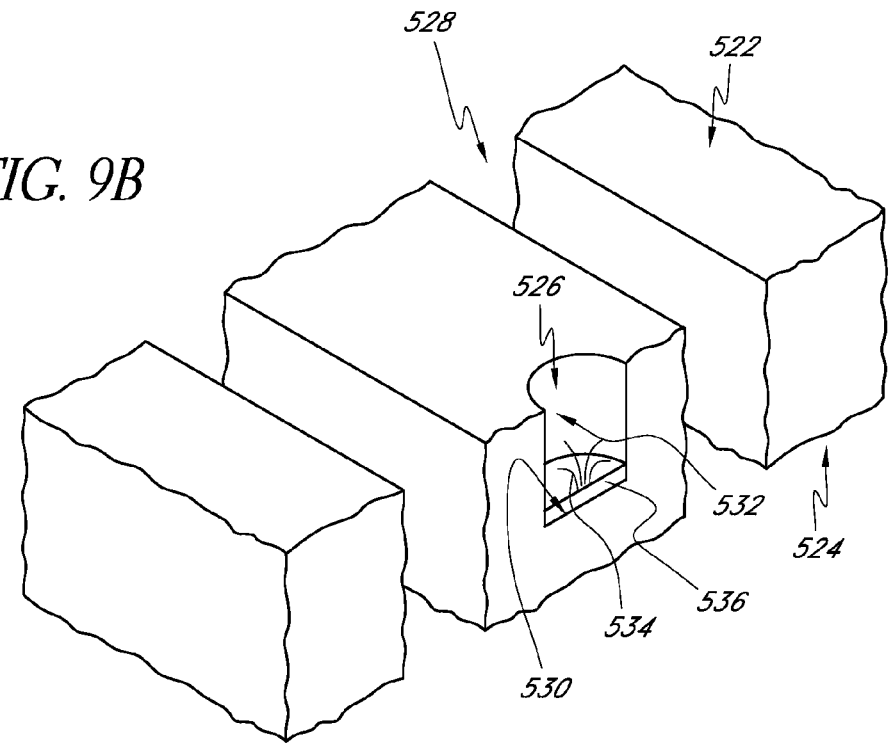

FIGS. 9A-9B illustrate another embodiment of the holder structure using conductive brushes that are used in the previous embodiment. Of course, use of conductive brushes is for the purpose of exemplifying subject embodiment. Contact electrodes with any other shape and geometry may be used with the embodiments described in connection to FIGS. 9A-9B. Similarly, use of different shape, size and geometry of process units and contact units as well as their possible distribution alternatives on the holder structures are within the scope of this invention.

As illustrated in FIG. 9A in perspective view and in FIG. 9B in a partial perspective side view, a holder structure 520 is a variation of the holder structure 500 shown in the previous embodiment. The holder structure 520 comprises contact units 526 and process units 528. The process units 528 in this example are placed in diagonal fashion and equidistantly parallel to one another. The process units in this embodiment are shaped as slits extending between the top and bottom surfaces 522, 524 of the holder structure 520 and allowing process solution to flow. The contact units in this embodiment are shaped as holes in the holder structure. The contact units 526 include a bottom wall 530 and side-wall 532 which is cylindrical in this example. Conductive brushes 534 are placed on the bottom wall 530 of the contact units 526 and connected to a terminal of a power supply (not shown). As described above, the contact electrodes 534 may be placed on an electrode base 536.

Figure 10A:
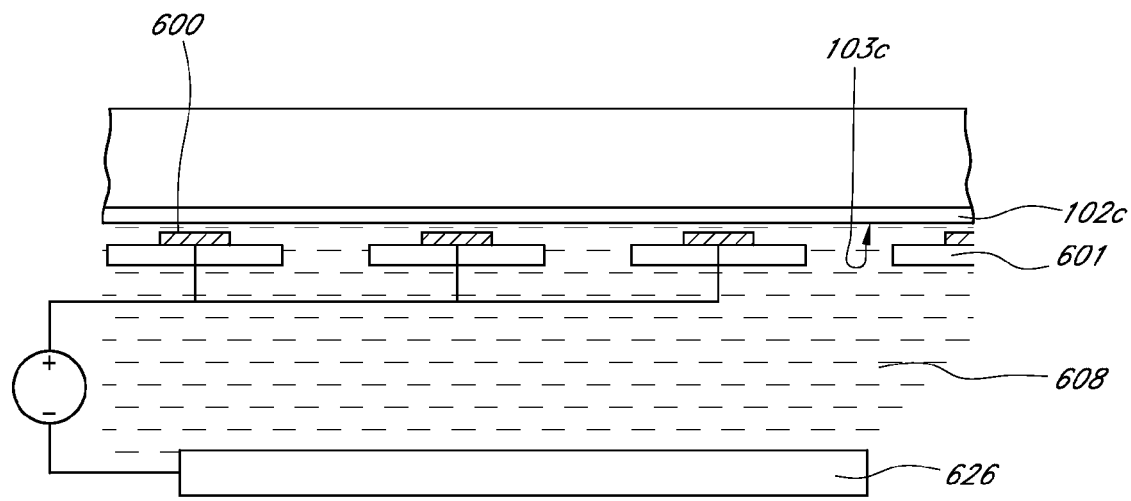
FIGS. 10A-10B are schematic illustrations of other embodiments of an electropolishing system of the present invention using multiple contact electrodes with a single process electrode.
Figure 10B:
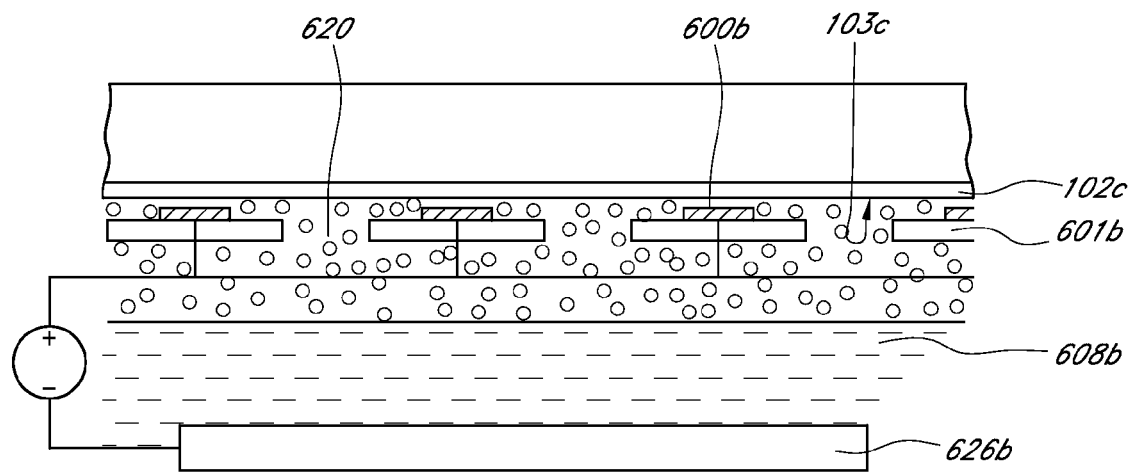

Two other designs that employ the buried electrical contact concept of the present invention are shown in FIGS. 10A and 10B. As shown in FIG. 10A, contact electrodes 600 are over supports 601 and they are in close proximity of the surface 103c of the copper layer 102c. The supports 601 may be held by a holder structure (not shown), which may be made of an open frame. Supports 601 are made of insulating material and they reduce the electrical current leakage that may flow from the contact electrodes 600 through the electropolishing solution 608, to the electrode 626 when a voltage rendering the contact electrodes anodic is applied between the electrode and the contact electrodes. In operation, contact electrodes 600 do not touch the surface 103c. However, close proximity of them to the surface electrically couples the contact electrodes 600 to the copper surface 103c. As in previous examples, most of the material removal takes place on the wafer surface in the area in between the contact electrodes, i.e., process openings. Reduction of leakage current is important in this design. Such reduction may be achieved by insulating all surfaces of contact electrodes except the surface facing the wafer and by reducing the distance between the wafer and the contact electrodes. A version of the design in FIG. 10A that can be used for touchprocessing is shown in FIG. 10B. In FIG. 10B, the contact electrodes 600b and structures 601b are buried in a spongy material 620 or a pad material. The spongy material may be a porous polymeric pad that allows the electroetching solution 608b to wet the wafer surface as well as the contact electrodes 626b. During electropolishing, the surface of the copper layer 102c may or may not touch the surface of the pad material. Again, in this embodiment, most of the material removal takes place on the wafer surface in the area in between the contact electrodes, i.e., process openings, which may contain the spongy material as shown in FIG. 10B, or spongy material may be removed from these process openings to reduce electrical resistance and resistance to flow of the electrolyte. The surface of the pad material may comprise abrasives to assist material removal process, especially if planarization is required during electropolishing, i.e., the starting copper surface is non-planar.

FIGS. 11A and 11B schematically illustrates exemplary stages of an electropolishing process using the system described in FIG. 10A. In this example for the purpose of clarification, a system 700 with two contact electrodes, a first contact electrode 701a and a second contact electrode 701b. The electrodes are placed on supports 702 and connected to a positive terminal of a power supply. In this respect, a cathode electrode 705 is also connected to a negative terminal of the power supply. Since the electropolishing process is exemplified with two contact electrodes, a portion of cathode electrode 705 is shown in FIGS. 11A-11B.

Electropolishing process is applied to an exemplary substrate 704 having a copper layer 706. The material removal takes place on the wafer surface in a process opening 707 in between the contact electrodes. The substrate 704 may be a semiconductor substrate including features 708 filled with copper layer. The features 708 and the surface of the substrate 704 may be lined with a barrier layer 710, which has generally a lesser conductivity than the conductivity of the copper. As described before, Ta, W, WN, WCN or TaN are the typical barrier materials for copper deposition. A copper removal solution such as an electropolishing solution 712 is in contact with the copper layer 706 and the cathode electrode 705 (see also FIG. 10A).

As shown in FIG. 11A, during an instant of the electropolishing process the contact electrodes 701a and 701b are placed in close proximity of the copper layer. As the current from the contact electrodes 701a and 701b flow through the copper layer 706, a surface portion 714a of the copper layer 706 is removed or electropolished. The surface portion is the portion of the copper layer that is located across the process hole 707 and the contact electrodes. As shown in FIG. 11A, direction of the current flow from the first contact electrode 701a and the second contact electrode 701b is depicted with the arrows A and B respectively. The electropolishing uniformly reduces the thickness of the copper layer down to the barrier layer level and continues as long as conductive copper remains on the barrier layer. It will be appreciated that during the removal of the portion 714, resistance against the current flow increases and the current flow chooses the least resistive path where it may still have conductive copper and continues etching the remaining copper until the surface portion 714 is almost entirely removed. This brings the electropolishing of the copper layer to a stop at that location of the surface, i.e., process self-limits, before moving over the neighboring location as shown in FIG. 11B. FIG. 11B shows another instant during the electropolishing process, as the system 700 moves over the remaining portion of the copper layer 706. As the contact electrode 701*a* moves over the copper layer 706, current flows through the remaining layer and starts electropolishing process. At this instant, since the second contact electrode is still over the exposed barrier layer, current flow from the second electrode faces resistance. This causes a larger current $I_1$ to flow through the first electrode 701*a* and through the path A compared to the current $I_2$ that flows through the second electrode 701*b*. The current flow from the first contact electrode causes electropolishing of the remaining copper, whereas the small current or lack of current through the electrode 701*b* arrests further copper removal from the areas where barrier is exposed. Accordingly, the system 700 is able to reduce and increase the current flow from a particular contact electrode depending on the remaining copper across that particular electrode as the process progresses and once the barrier is exposed copper removal is drastically reduced or arrested to avoid copper loss from within the features 708.

It should be noted that various features, such as bubble elimination means, discussed in relation with a certain design in this patent application may also be used for the other designs given. Although the nature of the power supply is not defined, it should be understood that the power supply might be a DC power supply or a variable voltage power supply such as a pulse generator. The electropolishing voltage or current may be varied during the process to obtain the best process results in terms of uniform material removal and surface quality of the resulting workpiece surface. For example, to obtain smooth surfaces a high current density, i.e. higher polishing voltage, may be used early in the process but then the current density may be reduced to have more accurate endpoint detection. Contact and process regions may have many different shapes and sizes. Distance between contact electrodes and the workpiece surface may be uniform throughout or may be variable. Electropolishing solutions that can be used for copper removal include commonly employed phosphoric acid solutions.

Although various preferred embodiments and the best mode have been described in detail above, those skilled in the art will readily appreciate that many modifications of the exemplary embodiment are possible without materially departing from the novel teachings and advantages of this invention.

We claim:

1. A process for electropolishing a surface of a conductive layer of a workpiece, the process comprising:
    immersing a plurality of contact electrodes in a contact solution;
    contacting a portion of the surface of the conductive layer with the contact solution to define a plurality of contact regions opposite to each of the contact electrodes;
    immersing a process electrode in a process solution;
    contacting a portion of the surface of the conductive layer with the process solution to define a plurality of process regions;
    applying an electrical potential between the plurality of contact electrodes and the process electrode to electropolish the surface of the conductive layer in the plurality of process regions, each of the plurality of contact electrodes and the process electrode being spaced from the conductive layer while applying the electrical potential; and
    touching the surface of the conductive layer with a top surface of a pad to planarize the surface of the conductive layer while applying the electrical potential.

2. The process of claim 1 further comprising moving at least one of the contact regions and the process regions relative to the surface of the conductive layer.

3. The process of claim 2, further comprising maintaining a relative motion between the conductive layer and at least one of the contact and process regions so that each point on the surface of the conductive layer is at least once opposite to one of the contact regions and so that each point on the surface of the conductive layer is at least once opposite to one of the process regions, resulting in electropolishing of substantially the whole surface of the conductive layer.

4. The process of claim 1, wherein the contact solution and the process solution are a same conductive solution.

5. The process of claim 1, wherein touching the surface of the conductive layer includes intermittently contacting the surface of the conductive layer with the top surface of the pad.

6. The process of claim 1, wherein the top surface of the pad includes abrasives.

7. The process of claim 6 wherein applying the electrical potential and touching the surface of the conductive layer comprises planarizing the surface of the conductive layer.

8. A method for electropolishing a surface of a conductive layer of a workpiece using an electropolishing system, the method comprising:
    placing a plurality of distributed contacts proximate to the surface of the conductive layer, the contacts formed in a holder structure, each contact having a contact electrode in communication with a conductive solution in contact with the surface of the conductive layer;
    contacting a process electrode with the conductive solution through an aperture in the holder structure to define a process region;
    applying a potential difference between the contact electrodes of the plurality of distributed contacts and the process electrode to electropolish the surface of the conductive layer in the process region, wherein the contact electrodes and the process electrode are not in physical contact with the conductive layer while applying the potential difference; and
    planarizing the surface of the conductive layer with a pad, wherein the holder structure comprises the pad.

9. The method of claim 8 further comprising moving the surface of the conductive layer with respect to the plurality of distributed contacts to electropolish the workpiece.

10. The method of claim 8, wherein the electropolishing system further comprises a first electropolishing zone having a first set of distributed contacts and a second electropolishing zone having a second set of distributed contacts, and wherein applying the potential difference includes:
    applying a first potential difference between the first set of distributed contacts and the process electrode to electropolish the first electropolishing zone; and
    applying a second potential difference between the second set of distributed contacts and the process electrode to electropolish the second electropolishing zone.

11. The method of claim 10, wherein the electropolishing system further comprises a zone switch and wherein the method includes:
    selecting the first set of distributed contacts to electropolish the first electropolishing zone; and
    selecting the second set of distributed contacts to electropolish the second electropolishing zone.

12. The method of claim 8, wherein the potential difference is a DC voltage.

13. The method of claim 8, wherein the potential difference is a variable voltage.

14. The method of claim 8, wherein the process electrode includes a plurality of process electrodes, each process electrode being disposed within an opening in the holder structure and wherein applying the potential difference includes applying the potential difference between the plurality of contact electrodes and the plurality process electrodes.

15. The method of claim 14, wherein each process electrode substantially occupies each opening.

16. The method of claim 8, wherein the pad comprises an abrasive material.

17. The method of claim 8, wherein the pad is disposed between the plurality of distributed contacts and the surface of the conductive layer.

18. The method of claim 8, wherein contacting the process electrode with the conductive solution comprises contacting the process electrode through a plurality of apertures in the holder structure to define a plurality of process regions and wherein applying the potential difference electropolishes the surface of the conductive layer in the plurality of process regions.

19. A method for electropolishing a surface of a conductive layer of a workpiece using an electropolishing system, the method comprising:

placing a plurality of distributed contacts proximate to the surface of the conductive layer, the contacts formed in a holder structure, each contact having a contact electrode in communication with a conductive solution in contact with the surface of the conductive layer, wherein, the electropolishing system further comprises a first electropolishing zone having a first set of distributed contacts and a second electropolishing zone having a second set of distributed contacts;

contacting a process electrode with the conductive solution through an aperture in the holder structure to define a process region;

applying a potential difference between the contact electrodes of the plurality of distributed contacts and the process electrode to electropolish the surface of the conductive layer in the process region, wherein the contact electrodes and the process electrode are not in physical contact with the conductive layer while applying the potential difference, wherein applying the potential difference includes:

applying a first potential difference between the first set of distributed contacts and the process electrode to electropolish the first electropolishing zone; and applying a second potential difference between the second set of distributed contacts and the process electrode to electropolish the second electropolishing zone; and planarizing the surface of the conductive layer with a pad, wherein the holder structure comprises the pad, wherein the first potential difference is different from the second potential difference.

* * * * *

UNITED STATES PATENT AND TRADEMARK OFFICE
CERTIFICATE OF CORRECTION

| | | |
|---|---|---|
| PATENT NO. | : 7,578,923 B2 | Page 1 of 1 |
| APPLICATION NO. | : 10/391924 | |
| DATED | : August 25, 2009 | |
| INVENTOR(S) | : Bulent M. Basol et al. | |

It is certified that error appears in the above-identified patent and that said Letters Patent is hereby corrected as shown below:

Title Page, (*) Notice: Subject to any disclaimer, the term of this patent is extended or adjusted under 35 U.S.C. 154(b) by 73 days.

should read (*) Notice: Subject to any disclaimer, the term of this patent is extended or adjusted under 35 U.S.C. 154(b) by 83 days.

At Column 20, Line 1, in Claim 19, change "wherein," to --wherein--.

Signed and Sealed this

Twenty-second Day of June, 2010

David J. Kappos
*Director of the United States Patent and Trademark Office*

UNITED STATES PATENT AND TRADEMARK OFFICE
CERTIFICATE OF CORRECTION

PATENT NO.        : 7,578,923 B2
APPLICATION NO. : 10/391924
DATED             : August 25, 2009
INVENTOR(S)       : Basol et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 83 days.

Signed and Sealed this

Fourteenth Day of September, 2010

David J. Kappos
*Director of the United States Patent and Trademark Office*